US009755372B2

(12) United States Patent
Ozeki

(10) Patent No.: US 9,755,372 B2
(45) Date of Patent: Sep. 5, 2017

(54) BOARD-CONNECTING ELECTRIC CONNECTOR

(71) Applicant: Dai-Ichi Seiko Co., Ltd., Kyoto-shi (JP)

(72) Inventor: Kosuke Ozeki, Fukuoka (JP)

(73) Assignee: DAI-ICHI SEIKO CO., LTD., Kyoto-shi (JP)

( * ) Notice: Subject to any disclaimer, the term of this patent is extended or adjusted under 35 U.S.C. 154(b) by 0 days.

(21) Appl. No.: 15/181,667

(22) Filed: Jun. 14, 2016

(65) Prior Publication Data

US 2017/0033510 A1 Feb. 2, 2017

(30) Foreign Application Priority Data

Jul. 29, 2015 (JP) ................................ 2015-149547

(51) Int. Cl.
*H01R 13/6591* (2011.01)
*G01N 21/956* (2006.01)
(Continued)

(52) U.S. Cl.
CPC ....... *H01R 13/6591* (2013.01); *G01N 21/956* (2013.01); *H01R 12/57* (2013.01);
(Continued)

(58) Field of Classification Search
CPC H01R 13/6585; H01R 12/585; H01R 12/724; H01R 13/6471; H01R 13/6587;
(Continued)

(56) References Cited

U.S. PATENT DOCUMENTS

2002/0068481 A1* 6/2002 Flickinger ........ H01R 13/65802 439/607.23
2005/0037642 A1* 2/2005 Zhang ................ H01R 23/6873 439/74

(Continued)

FOREIGN PATENT DOCUMENTS

JP 4333884 9/2009
JP 2011-119119 A 6/2011

(Continued)

OTHER PUBLICATIONS

Office Action issued Feb. 1, 2017 in Japanese Patent Application No. 2015-149547.

*Primary Examiner* — Truc Nguyen
(74) *Attorney, Agent, or Firm* — Oblon, McClelland, Maier & Neustadt, L.L.P.

(57) ABSTRACT

The connection state of contact members with respect to a wiring board can be easily visually checked by a simple configuration. A shield wall portion composed of an electrically-conductive member opposed to contact connecting portions (board connecting portions) of a plurality of contact members arranged in a multipolar shape is provided; each of ground connecting portions provided in the shield wall portion is disposed at the part between the contact connecting portions, which are adjacent to each other; a lateral check window composed of the space which enables visual check of the contact connecting portions is formed in the interval region in which the ground connecting portions are adjacent to each other; an electromagnetic shielding function with respect to the contact connecting portions is obtained by the shield wall portion; and, at the same time, the connection state of the contact connecting portions with respect to the wiring board can be visually checked through the lateral check window provided in the shield wall portion.

6 Claims, 31 Drawing Sheets

(51) Int. Cl.

| | |
|---|---|
| ***H01R 12/57*** | (2011.01) |
| ***H01R 13/6594*** | (2011.01) |
| ***H01R 43/20*** | (2006.01) |
| ***H05K 13/08*** | (2006.01) |
| *H01R 12/71* | (2011.01) |

(52) U.S. Cl.
CPC ....... *H01R 13/6594* (2013.01); *H01R 43/205* (2013.01); *H05K 13/08* (2013.01); *H01R 12/716* (2013.01)

(58) Field of Classification Search
CPC ............ H01R 13/6594; H01R 2107/00; H01R 13/502; H01R 13/514; H01R 13/6461; H01R 13/6658; H01R 24/60; H01R 43/205; H01R 11/01
See application file for complete search history.

(56) References Cited

U.S. PATENT DOCUMENTS

| | | | | | |
|---|---|---|---|---|---|
| 2005/0282418 | A1* | 12/2005 | Fan | H01R 13/5213 | 439/148 |
| 2006/0105631 | A1* | 5/2006 | Yang | H01R 13/2442 | 439/71 |
| 2010/0304589 | A1* | 12/2010 | Tuin | H01R 24/46 | 439/188 |
| 2014/0024244 | A1* | 1/2014 | Fogg | H01R 4/64 | 439/352 |
| 2015/0064942 | A1* | 3/2015 | Takemoto | H01R 12/7029 | 439/74 |
| 2016/0020537 | A1* | 1/2016 | Ju | H01R 24/78 | 439/83 |

FOREIGN PATENT DOCUMENTS

| | | | |
|---|---|---|---|
| JP | 4901944 | | 3/2012 |
| JP | 2012-252785 | | 12/2012 |
| JP | 2013-20707 | A | 1/2013 |
| JP | 2013-218788 | A | 10/2013 |
| JP | 2014-192102 | | 10/2014 |
| JP | 2015-2081 | A | 1/2015 |

* cited by examiner

BOARD-CONNECTING ELECTRIC CONNECTOR

BACKGROUND OF THE INVENTION

Field of the Invention

The present invention relates to board-connecting electric connectors mutually connected in a state in which they are mounted on wiring boards.

Description of Related Art

Generally, in various electric devices, board-connecting electric connector devices referred to as stacking connectors, etc. are widely used. In the board-connecting electric connector device, for example, above a first electric connector (receptacle connector) coupled to a first wiring board, a second electric connector (plug connector) coupled to a second wiring board is disposed so as to be opposed thereto, the second electric connector in the upper side is pushed in so as to be lowered toward the first electric connector in the lower side from such a vertically opposed state, and both of the electric connectors are brought into a mutually mated state as a result, thereby electrically connecting the first and second wiring boards to each other.

The board-connecting electric connector like this is demanded to implement so-called EMI measures particularly along with the recent increase in the frequencies of transmission signals. For example, in Japanese Patent Application Laid-Open No. 2014-192102 described below, electromagnetic shielding with respect to the signal transmitting paths of contact members is carried out by surrounding the outer periphery of the electric connector (receptacle connector) by a shield wall (block wall).

However, if the shield wall like this is provided, the part at which the contact members are solder-connected to the wiring board is configured to be covered from the outer side by the shield wall, and, therefore, the connection state (solder-joint state) of the contact members and the wiring boards and the assembly state of the connectors cannot be visually checked. In other words, it becomes difficult to carry out tests to check, by visual or images, the presence/absence of warpage of the connectors (housings) before mounting and the mount state such as the presence/absence of uplift of the contact members from the wiring board after mounting, and a problem in reliability may occur.

Herein, the inventor of the present application discloses below Patent Document as prior techniques of the present invention.

[Patent Document 1] Japanese Patent Application Laid-Open No. 2014-192102

SUMMARY OF THE INVENTION

Therefore, it is an object of the present invention to provide a board-connecting electric connector that easily enables visual checks of the connection state, etc. of the contact members with respect to the wiring board by a simple configuration.

The invention according to claim 1 for achieving the above described object employs a configuration of an electric connector having a plurality of contact members attached to an insulating housing, the contact members arranged so as to form a multipolar shape in a connector longitudinal direction, and a contact connecting portion provided in each of the contact members so as to extend in a connector width direction and electrically connected to a wiring board side; the electric connector having: a shield wall portion composed of an electrically-conductive member opposed to the contact connecting portion in the connector width direction, the shield wall portion provided so as to extend along the connector longitudinal direction; a plurality of ground connecting portions electrically connected to the wiring board and formed in the shield wall portion along the connector longitudinal direction, each of the ground connecting portions disposed in a part between the contact connecting portions adjacent to each other in the connector longitudinal direction; and a lateral check window composed of space enabling visual check of the contact connecting portion in the connector width direction, the lateral check window formed in an interval region in which the ground connecting portions are adjacent to each other in the connector longitudinal direction.

According to the present invention provided with such a configuration, the electromagnetic shielding function with respect to the contact connecting portions is obtained, and, at the same time, the connection state, etc. of the contact connecting portions with respect to the wiring board can be visually checked through the lateral check window provided in the shield wall portion.

Also, in the present invention, it is desired that the shield wall portion be formed by a plate-shaped member extending along the connector longitudinal direction; the ground connecting portion be formed by a plate-shaped protruding piece projecting from an edge portion of the shield wall portion toward the wiring board side; and the plate-shaped protruding piece constituting the ground connecting portion be extending within a plate thickness of the plate-shaped member constituting the shield wall portion. The plate-shaped protruding piece can have a surface flat to the shield wall portion.

According to the present invention provided with such a configuration, the ground connecting portion is disposed in a state in which it is within the range of the plate thickness of the shield wall portion and does not bulge to the outer side of the shield wall portion. Therefore, the entire connector can be downsized.

Furthermore, it is desired that the shield wall portion be provided with a fixation latch piece extending so as to be bent from a connector-longitudinal-direction end portion of the shield wall portion toward the connector width direction; and the fixation latch piece be buried in a connector-longitudinal-direction edge part of the insulating housing.

According to the present invention provided with such a configuration, the shield wall portion is disposed in a state in which it is within the range of the total length of the insulating housing and does not bulge to the outer side of the insulating housing. Therefore, the entire connector can be downsized.

Furthermore, it is desired that the shield wall portion of the present invention be provided with a planar cover partially covering, approximately in parallel with the wiring board, a surface of the insulating housing.

According to the present invention provided with such a configuration, the electromagnetic shielding function with respect to the contact connecting portions is further enhanced by the planar cover.

Also, it is desired that a plurality of cover coupling portions coupled to the insulating housing be provided in the planar cover of the present invention along the connector longitudinal direction; the cover coupling portion be disposed in a part between the contact connecting portions adjacent to each other in the connector longitudinal direction; and a planar check window composed of a space enabling visual check of the contact connecting portion in a direction orthogonal to the wiring board be formed in an interval region in which the cover coupling portions are adjacent to each other in the connector longitudinal direction.

According to the present invention provided with such a configuration, the connection state of the contact connecting portions with respect to the wiring board can be visually checked through the planar check window provided in the planar cover.

Furthermore, it is desired that the shield wall portion or the planar cover of the present invention be integrally formed with a contact piece having a plate-spring shape elastically contacting a mating counterpart.

According to the present invention provided with such a configuration, since the electrical connection is established through the contact piece, ground resistance is reduced, and shield characteristics are correspondingly improved.

Furthermore, in the present invention, it is desired that the planar cover be formed by a plate-shaped member extending along the connector longitudinal direction; the cover coupling portion be formed so as to project from an edge portion of the planar cover toward a connector central side; and the cover coupling portion be extending within a plate thickness of the planar cover so as to have a surface flat to the planar cover and continued therefrom.

According to the present invention provided with such a configuration, the cover coupling portion is disposed in the state in which it is within the range of the plate thickness of the planar cover and does not bulge to the outer side of the planar cover. Therefore, the height of the entire connector can be reduced.

As described above, in the board-connecting electric connector according to the present invention, the shield wall portion composed of the electrically-conductive member opposed to the contact connecting portions, which are provided in the contact members, in the connector width direction is provided so as to extend along the connector longitudinal direction; each of the plurality of ground connecting portions provided in the shield wall portion is disposed in the part between the contact connecting portions, which are adjacent to each other in the connector longitudinal direction; and the lateral check window composed of the space which enables visual check of the contact connecting portions in the connector width direction is formed in the interval region in which the ground connecting portions are adjacent to each other in the connector longitudinal direction. Therefore, the electromagnetic shielding function with respect to the contact connecting portions is obtained by the shield wall portion, and, at the same time, the connection state, etc. of the contact connecting portions with respect to the wiring board can be visually checked through the lateral check window provided in the shield wall portion. Therefore, the connection state, etc. with respect to the wiring board can be easily visually checked, and the reliability of the board-connecting electric connector can be significantly increased at low cost.

DETAILED DESCRIPTION OF THE PREFERRED EMBODIMENT

Figure 1:
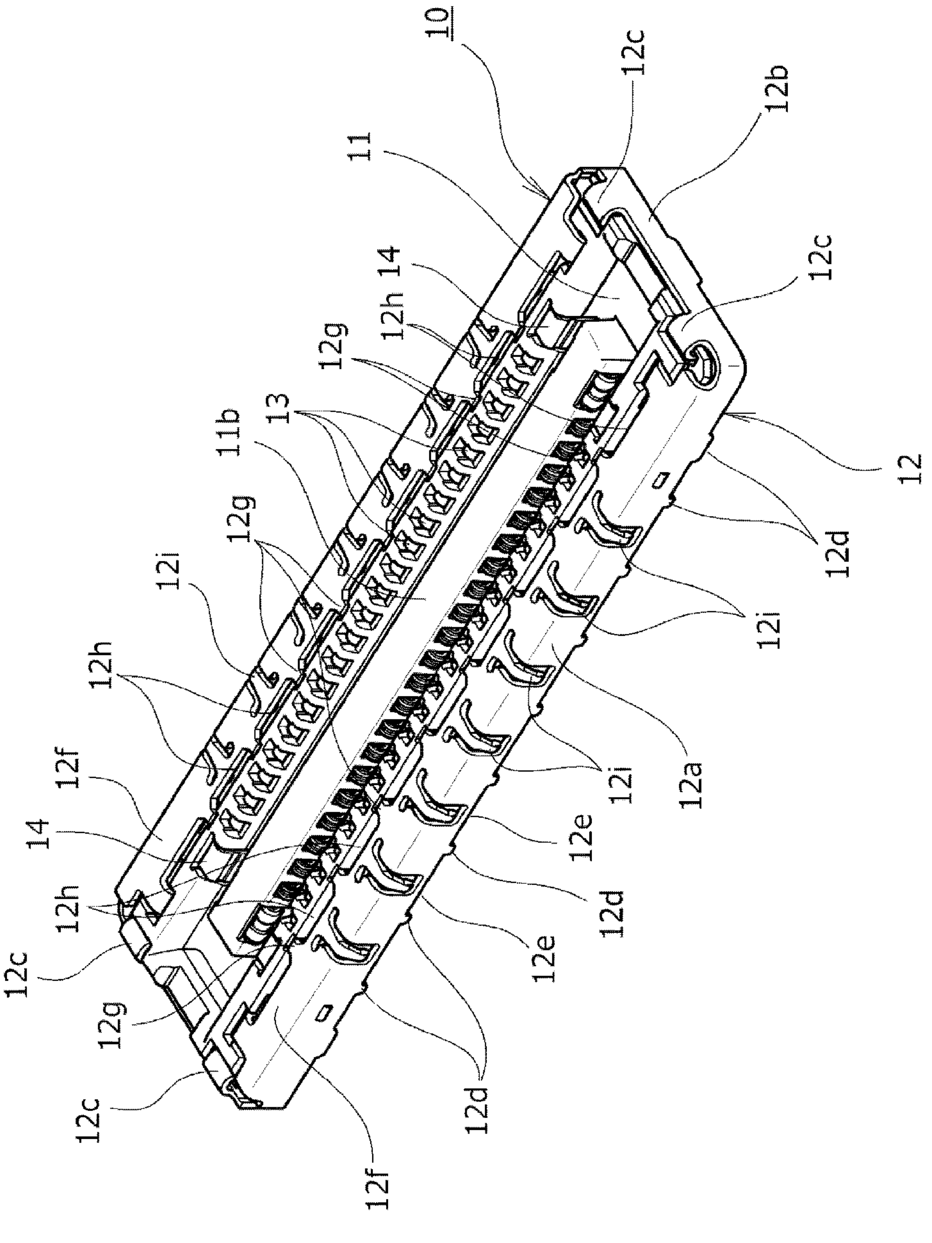
FIG. 1 is an explanatory external perspective view showing, from an upper side, a first electric connector (receptacle connector) according to an embodiment of the present invention.
Figure 2:
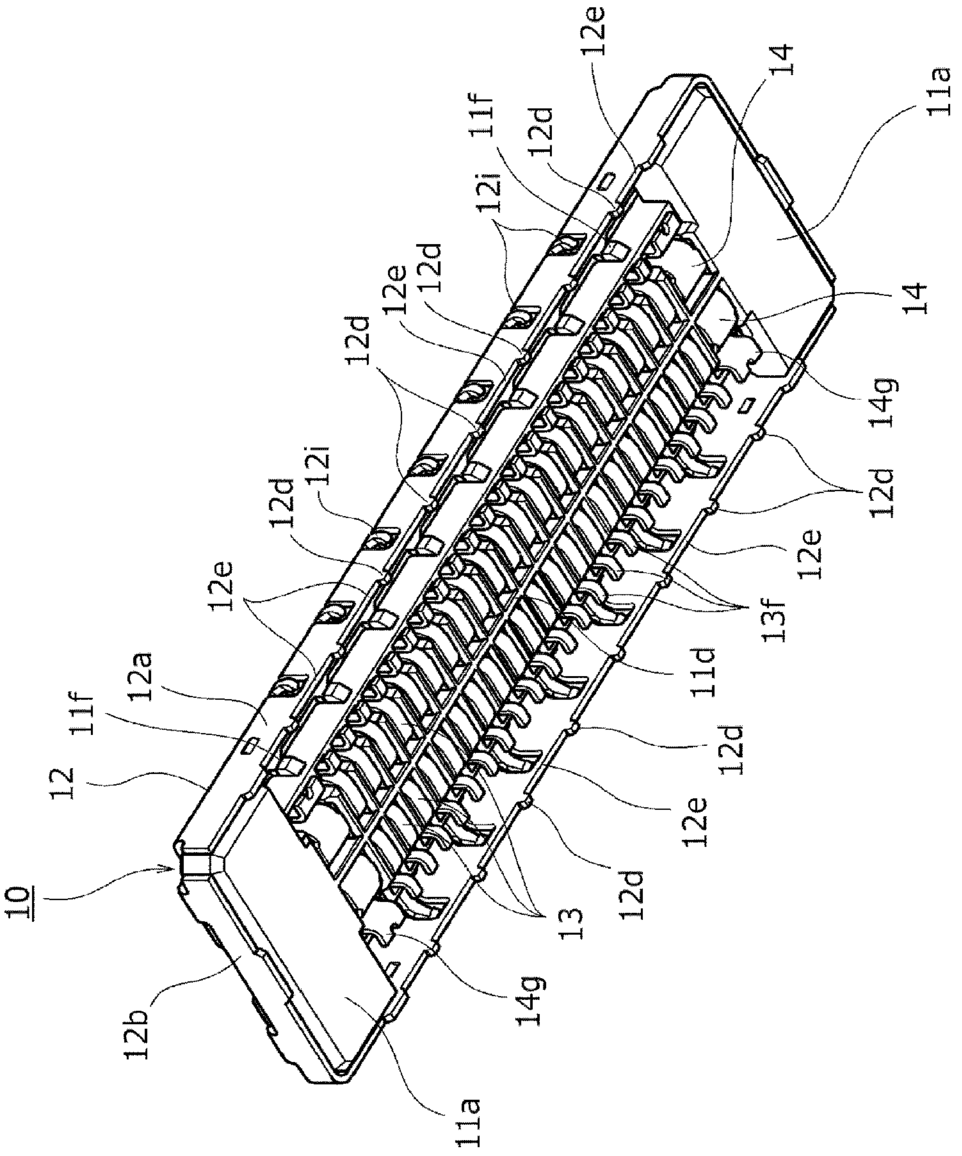
FIG. 2 is an explanatory external perspective view showing, from a lower side, the first electric connector (receptacle connector) according to the embodiment of the present invention shown in FIG. 1.
Figure 3:
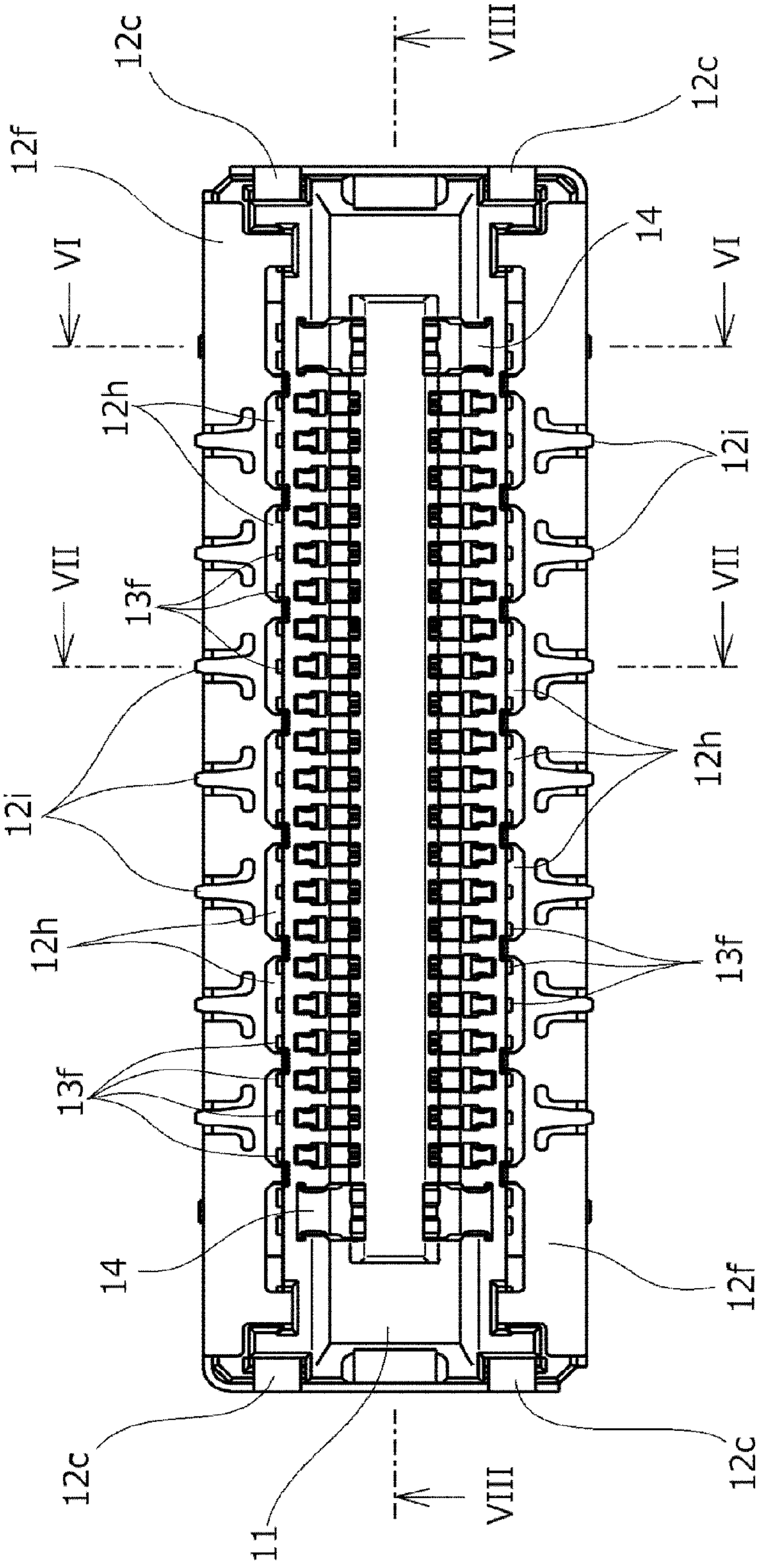
FIG. 3 is an explanatory plan view showing the first electric connector (receptacle connector) according to the embodiment of the present invention shown in FIG. 1 and FIG. 2.
Figure 4:
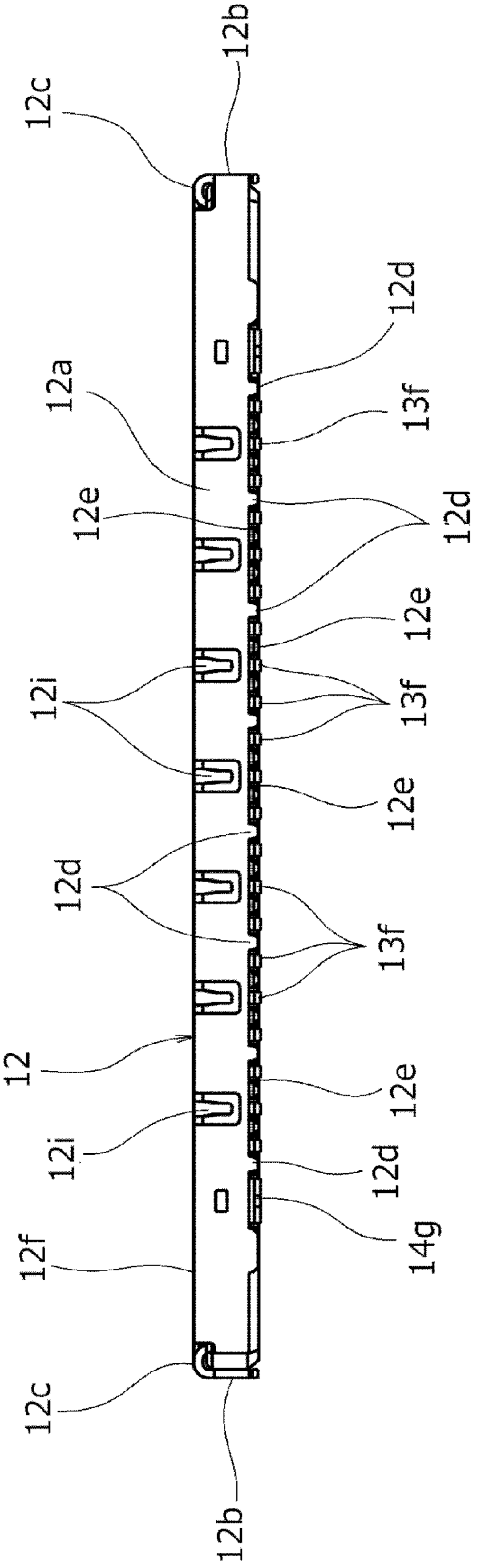
FIG. 4 is an explanatory front view showing the first electric connector (receptacle connector) according to the embodiment of the present invention shown in FIG. 1 to FIG. 3.
Figure 5:
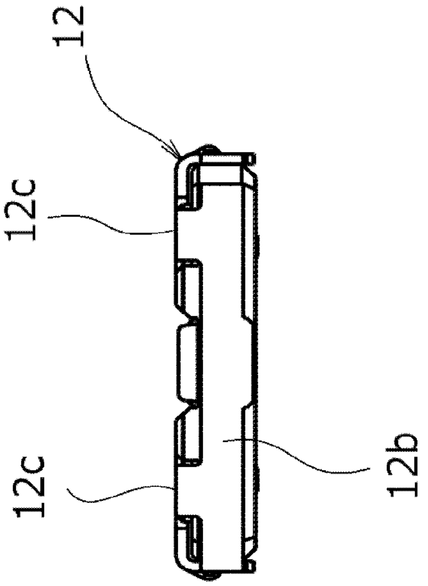
FIG. 5 is an explanatory lateral view showing the first electric connector (receptacle connector) according to the embodiment of the present invention shown in FIG. 1 to FIG. 4.

Hereinafter, an embodiment to which the present invention is applied will be described in detail based on drawings.

[About Overall Structure of Electric Connector Device]

A board-connecting electric connector device according to the embodiment of the present invention shown in the drawings is used for, for example, electrically connecting wiring boards, which are disposed in an electric device of various types such as a mobile phone, a smartphone, or a tablet-type computer, to each other and is composed of a receptacle connector 10 serving as a first electric connector shown in FIG. 1 to FIG. 9 and a plug connector 20 serving as a second electric connector shown in FIG. 10 to FIG. 18. The receptacle connector (first electric connector) 10 is mounted on a first wiring board P1 shown in, for example, FIG. 30; the plug connector (second electric connector) 20 is mounted on a second wiring board P2 shown in, for example FIG. 31; and, when both of the electric connectors 10 and 20, which are in such a mounted state, are disposed so as to be opposed to each other and are subjected to a mating operation, the above described first and second wiring boards P1 and P2 are electrically connected to each other.

Figure 27:
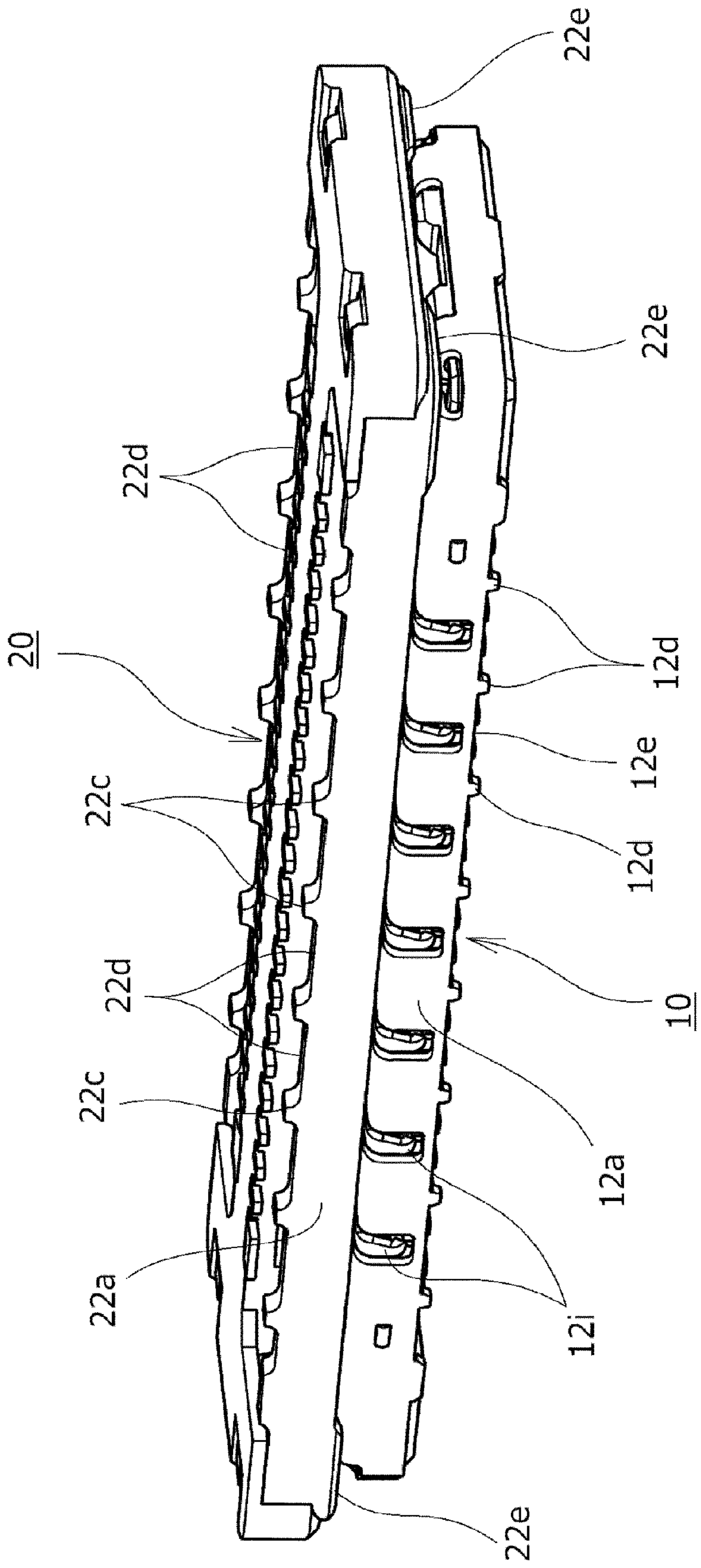
FIG. 27 is an explanatory external perspective view showing a positioned state for mutually mating the first and second electric connectors according to the embodiment of the present invention.
Figure 28:
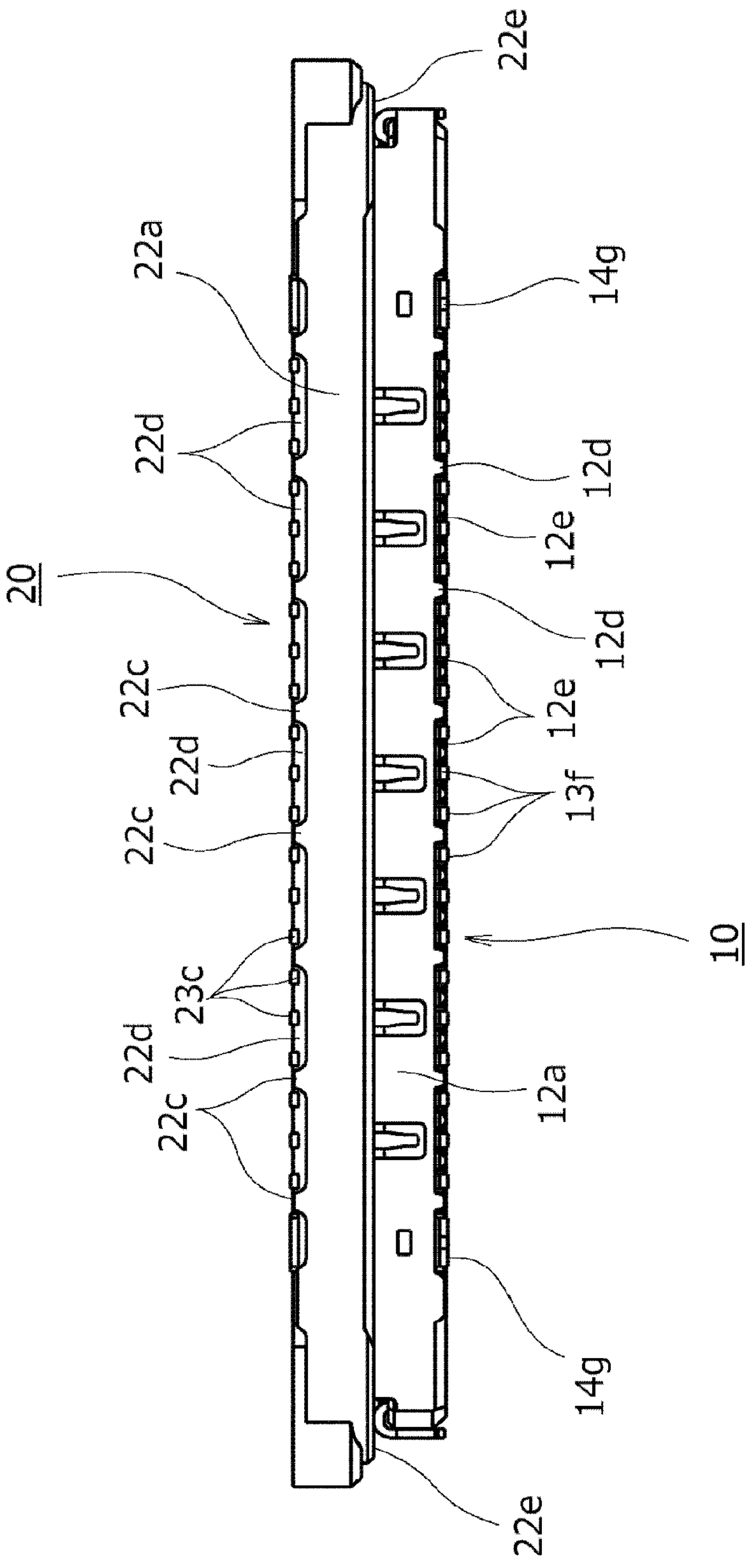
FIG. 28 is an explanatory front view showing the positioned state for mutually mating the first and second electric connectors according to the embodiment of the present invention.
Figure 29:
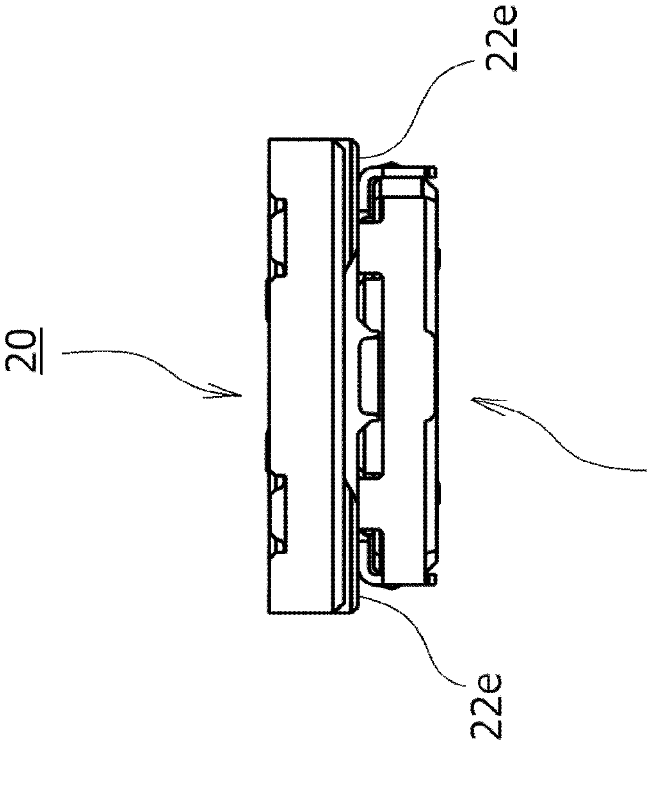
FIG. 29 is an explanatory lateral view showing the positioned state for mutually mating the first and second electric connectors according to the embodiment of the present invention.

In the below description, the mating direction of the receptacle connector (first electric connector) 10 and the plug connector (second electric connector) 20 is assumed to be "up-down direction". The plug connector 20 is disposed at a position above the receptacle connector 10, which is disposed at a lower position in the up-down direction; in such an opposed state in the up-down direction, a positioning operation is carried out in a state in which both of the electric connectors 10 and 20 contact each other as shown in FIG. 27 to FIG. 29; when they are positioned at mating positions, the plug connector 20 is pushed in toward a downward direction; and, as a result, both of the electric connectors 10 and 20 are caused to be in a mutually mated state as shown in FIG. 19 to FIG. 26.

Also, when the plug connector (second electric connector) 20 is pulled up toward the upper side with appropriate force from the above described mating state, the plug connector 20 is removed from the lower-side receptacle connector (first electric connector) 10 toward the upper side.

The operations of mating/removing the plug connector (second electric connector) 20 with/from the receptacle connector (first electric connector) 10 in this manner are not limited to be carried out by the hand(s) of an operator, but may be automatically carried out by a predetermined jig or machine.

Note that, when the mating/removal of both of the electric connectors 10 and 20 with/from each other is to be carried out, the plug connector (second electric connector) 20 disposed in the upper side is in a vertically inverted state and is disposed to be opposed to the receptacle connector (first electric connector) 10 disposed in the lower side. However, in the description of the single plug connector 20, the description will be given in the state before inversion, in other words, in the state in which the plug connector 20 is mounted from the upper side onto the second wiring board P2 disposed in the lower side.

The receptacle connector (first electric connector) 10 and the plug connector (second electric connector) 20, which constitute the board-connecting electric connector device like this, respectively have insulating housings 11 and 21 extending in long and thin shapes. The insulating housings 11 and 21 have undergone, for example, mold forming by using a resin material such as plastic, and many signal contact members 13 and 23 are arranged along the longitudinal direction of the insulating housings 11 and 21 so as to form multipolar shapes at predetermined pitches. The longitudinal direction of the insulating housings 11 and 21, which is the arrangement direction of the signal contact members 13 and 23, will be hereinafter referred to as "connector longitudinal direction", and the short-side direction orthogonal to the "connector longitudinal direction" and the "up-down direction" will be referred to as "connector width direction".

Figure 9:
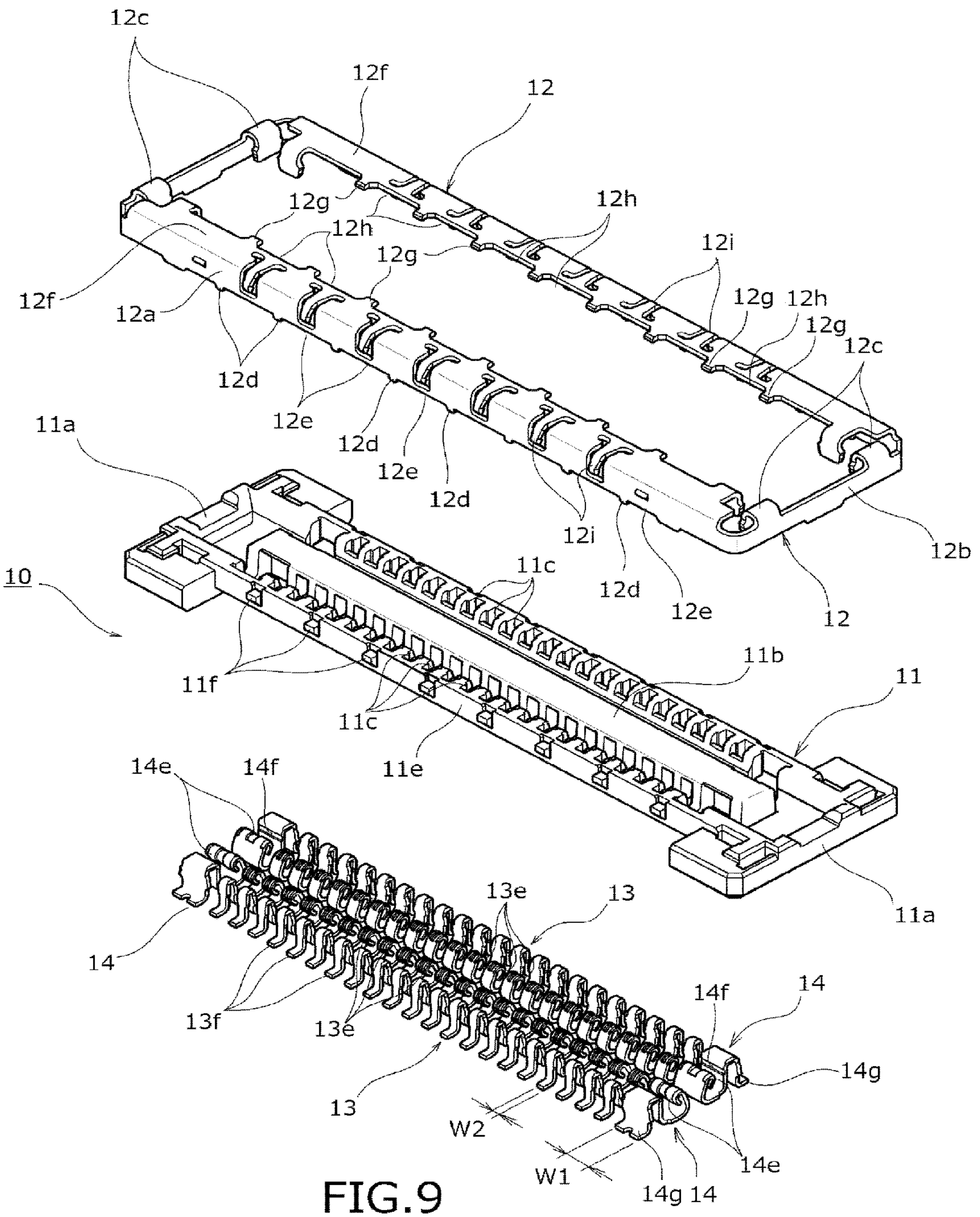
FIG. 9 is an explanatory external perspective view showing the first electric connector (receptacle connector) according to the embodiment of the present invention shown in FIG. 1 to FIG. 8 in an exploded manner.
Figure 10:
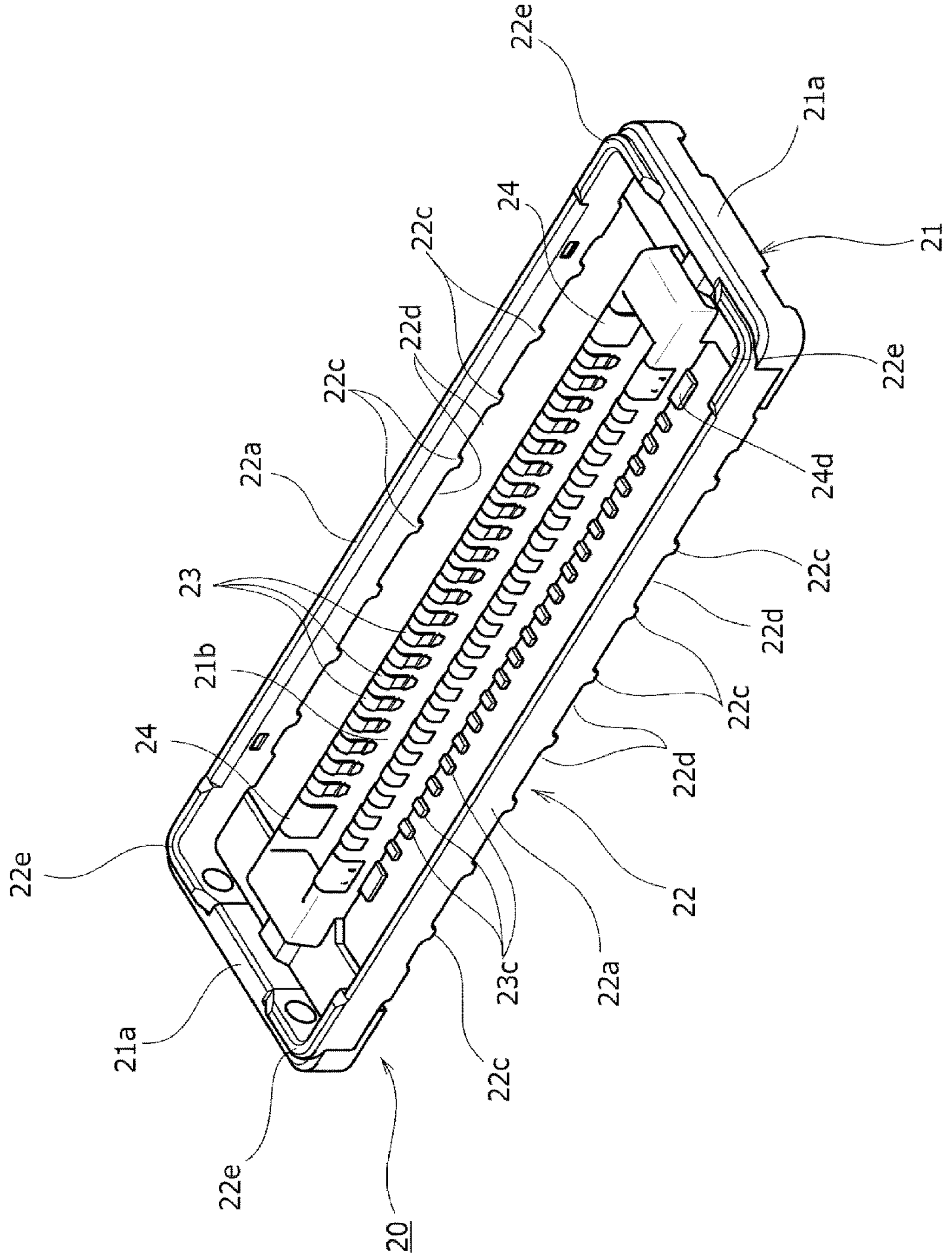
FIG. 10 is an explanatory external perspective view showing, from the upper side, a second electric connector (plug connector) according to the embodiment of the present invention to be mated with the first electric connector (receptacle connector) shown in FIG. 1 to FIG. 9.
Figure 11:
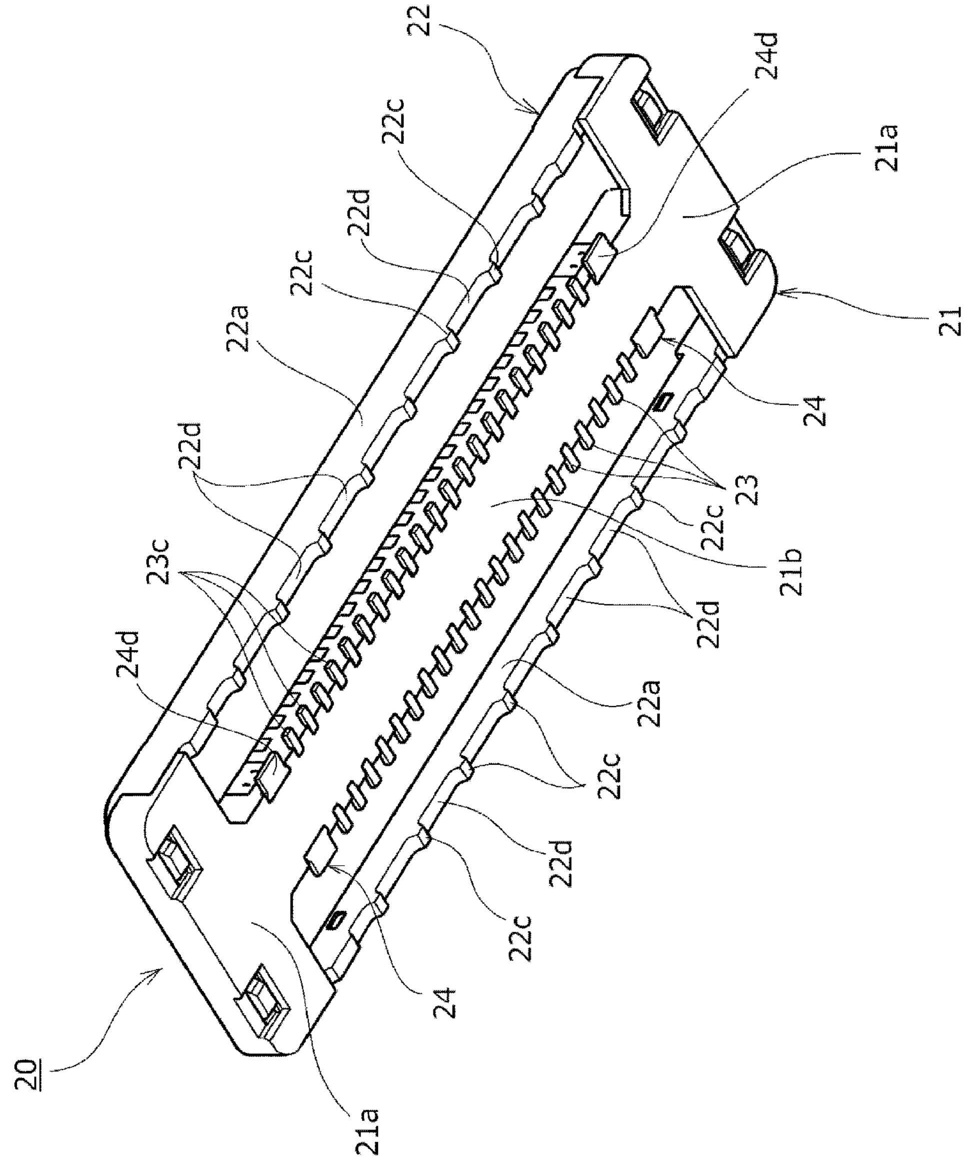
FIG. 11 is an explanatory external perspective view showing, from the lower side, the second electric connector (plug connector) according to the embodiment of the present invention shown in FIG. 10.
Figure 12:
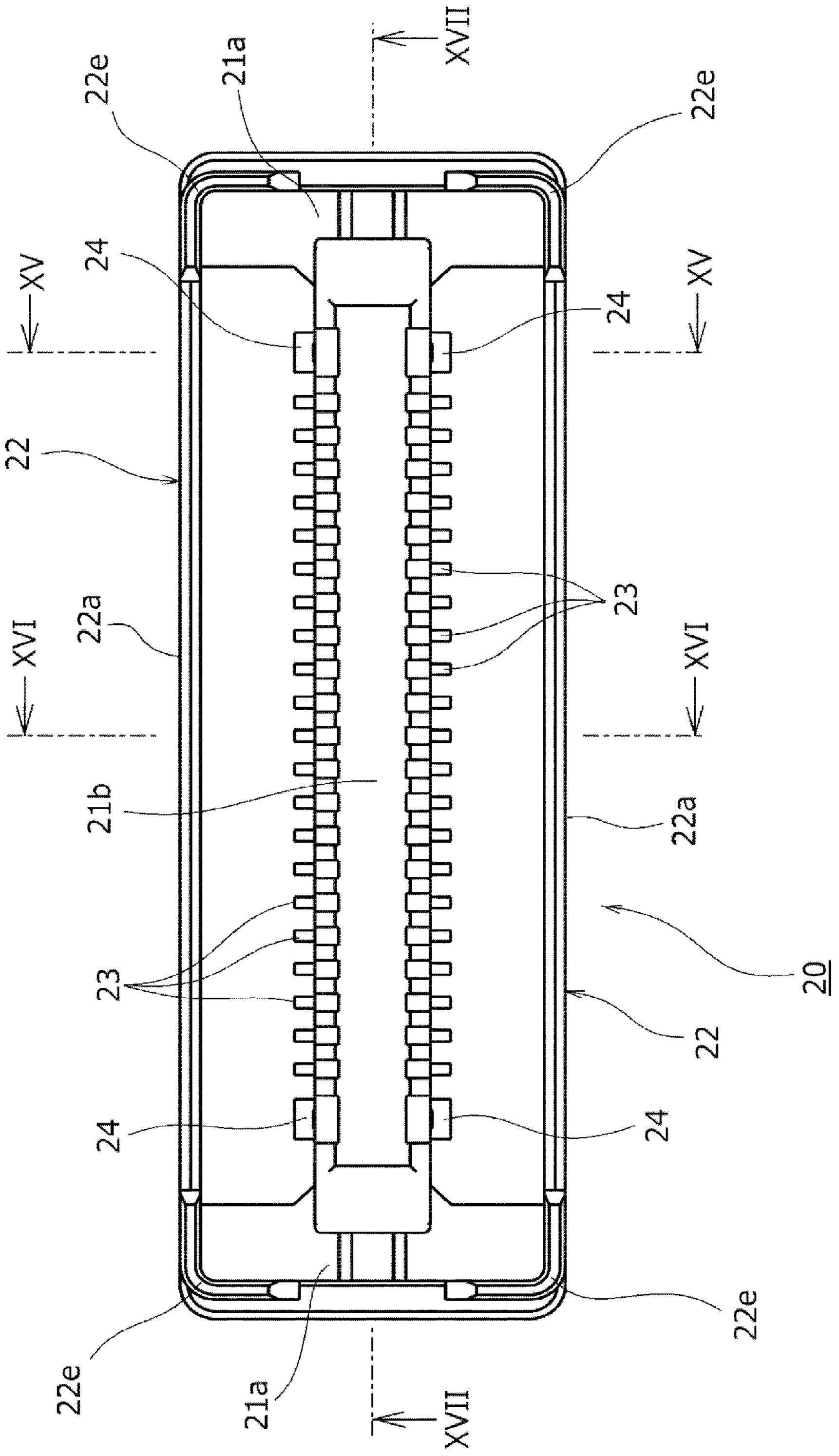
FIG. 12 is an explanatory plan view showing the second electric connector (plug connector) according to the embodiment of the present invention shown in FIG. 10 and FIG. 11.
Figure 13:
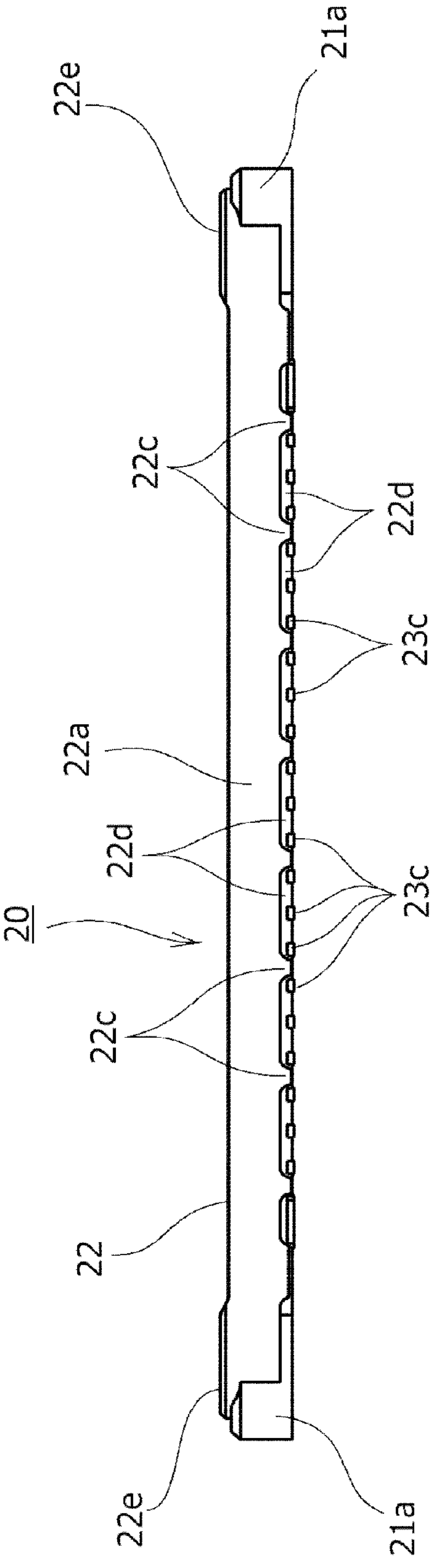
FIG. 13 is an explanatory front view showing the second electric connector (plug connector) according to the embodiment of the present invention shown in FIG. 10 to FIG. 12.
Figure 14:
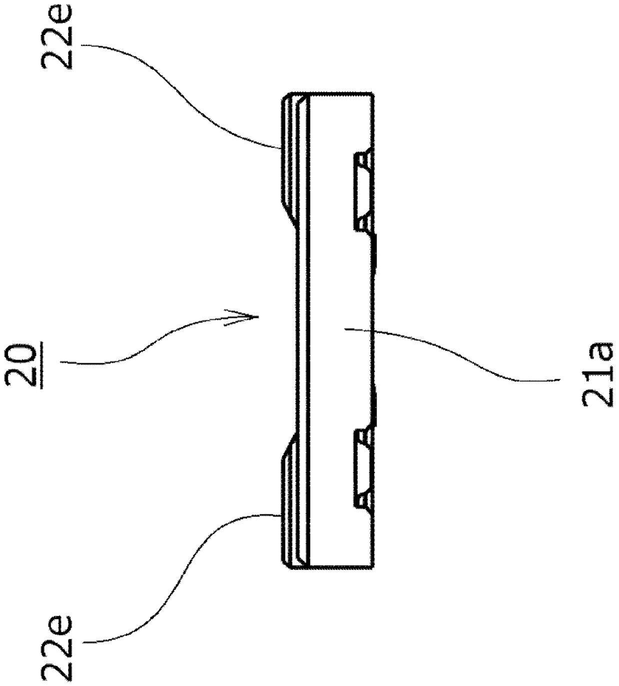
FIG. 14 is an explanatory lateral view showing the second electric connector (plug connector) according to the embodiment of the present invention shown in FIG. 10 to FIG. 13.
Figure 18:
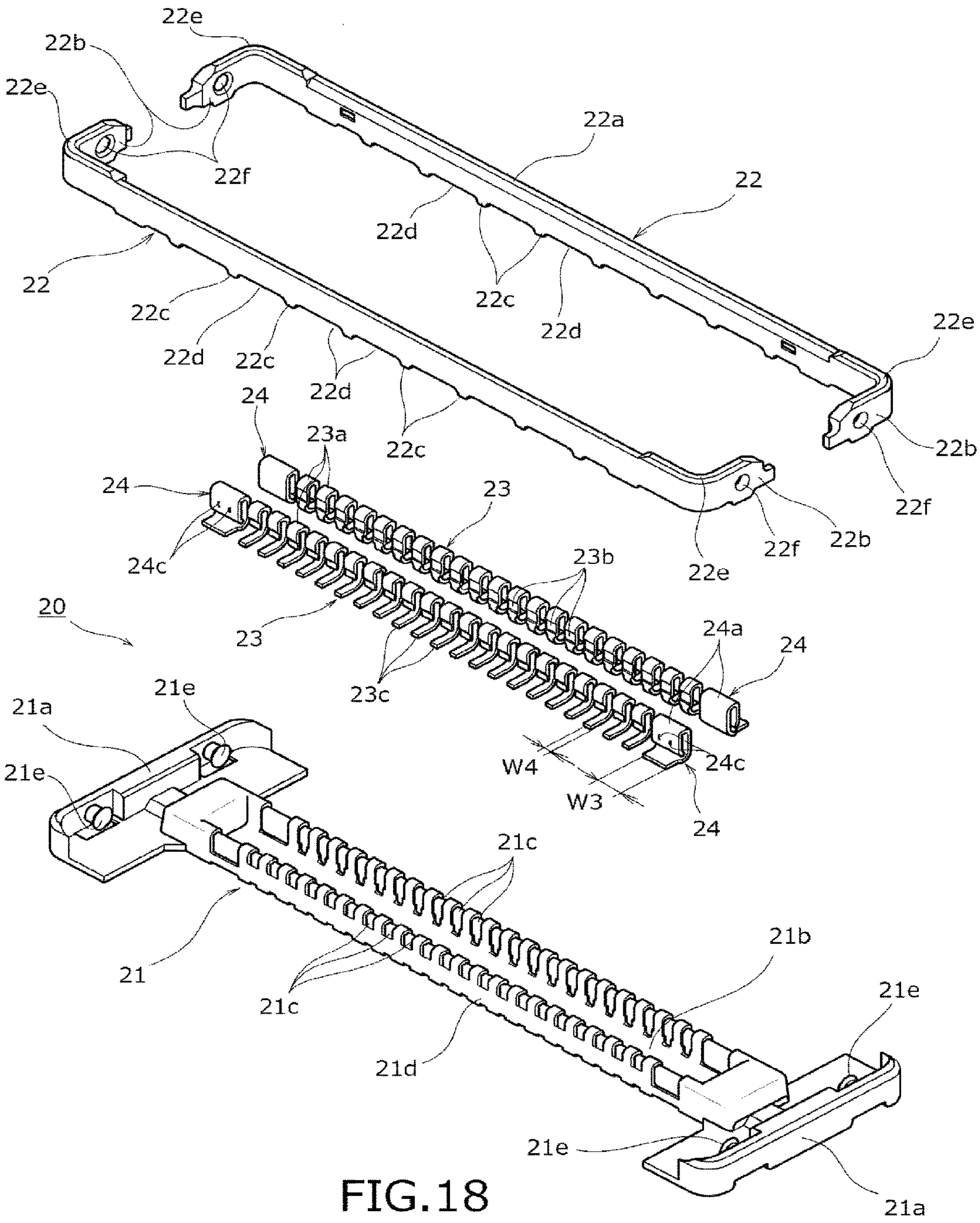
FIG. 18 is an explanatory external perspective view showing the second electric connector (plug connector) according to the embodiment of the present invention shown in FIG. 10 to FIG. 17 in an exploded manner.
Figure 19:
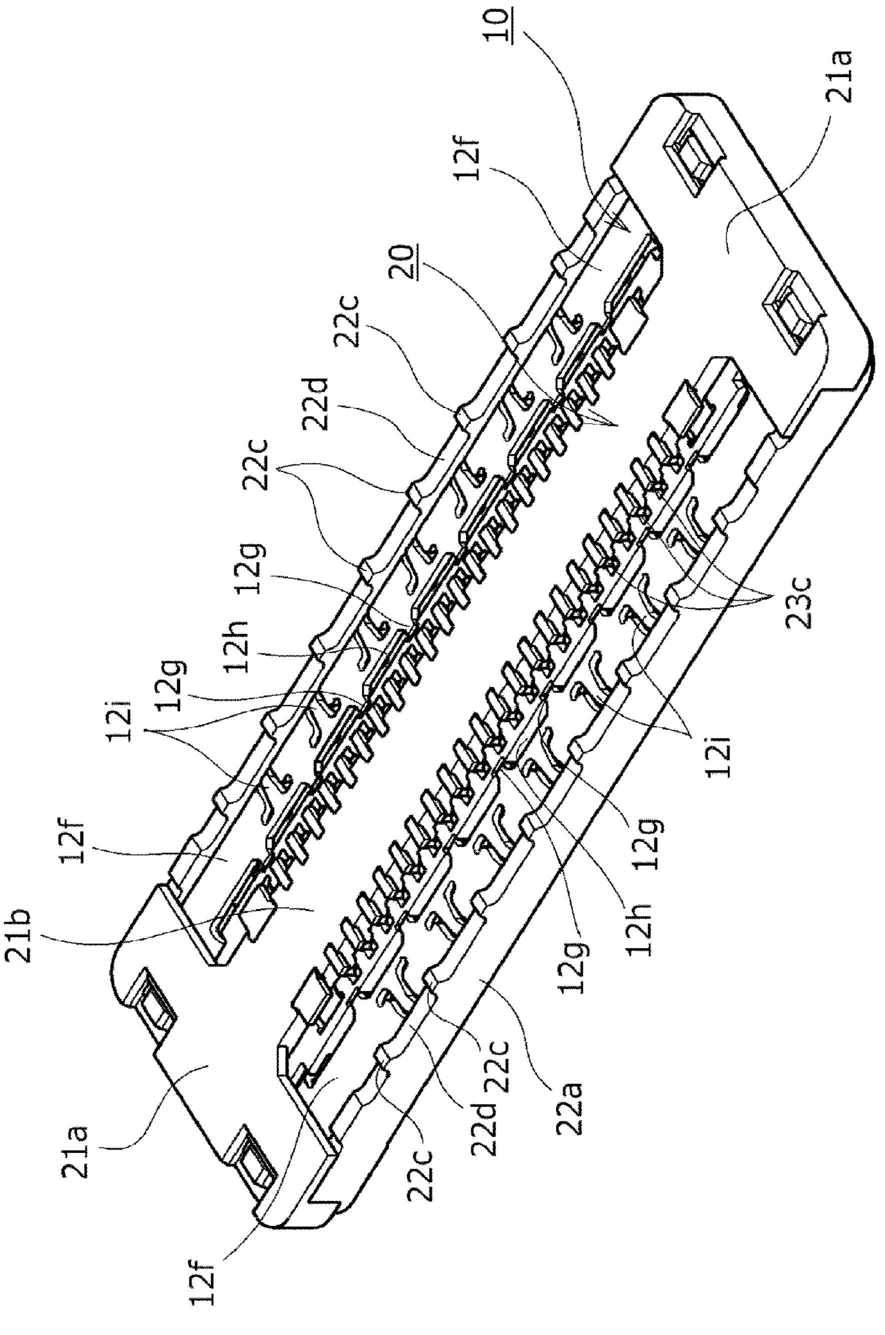
FIG. 19 is an explanatory external perspective view showing, from the upper side a state in which the first and second electric connectors according to the embodiment of the present invention are mated with each other.
Figure 20:
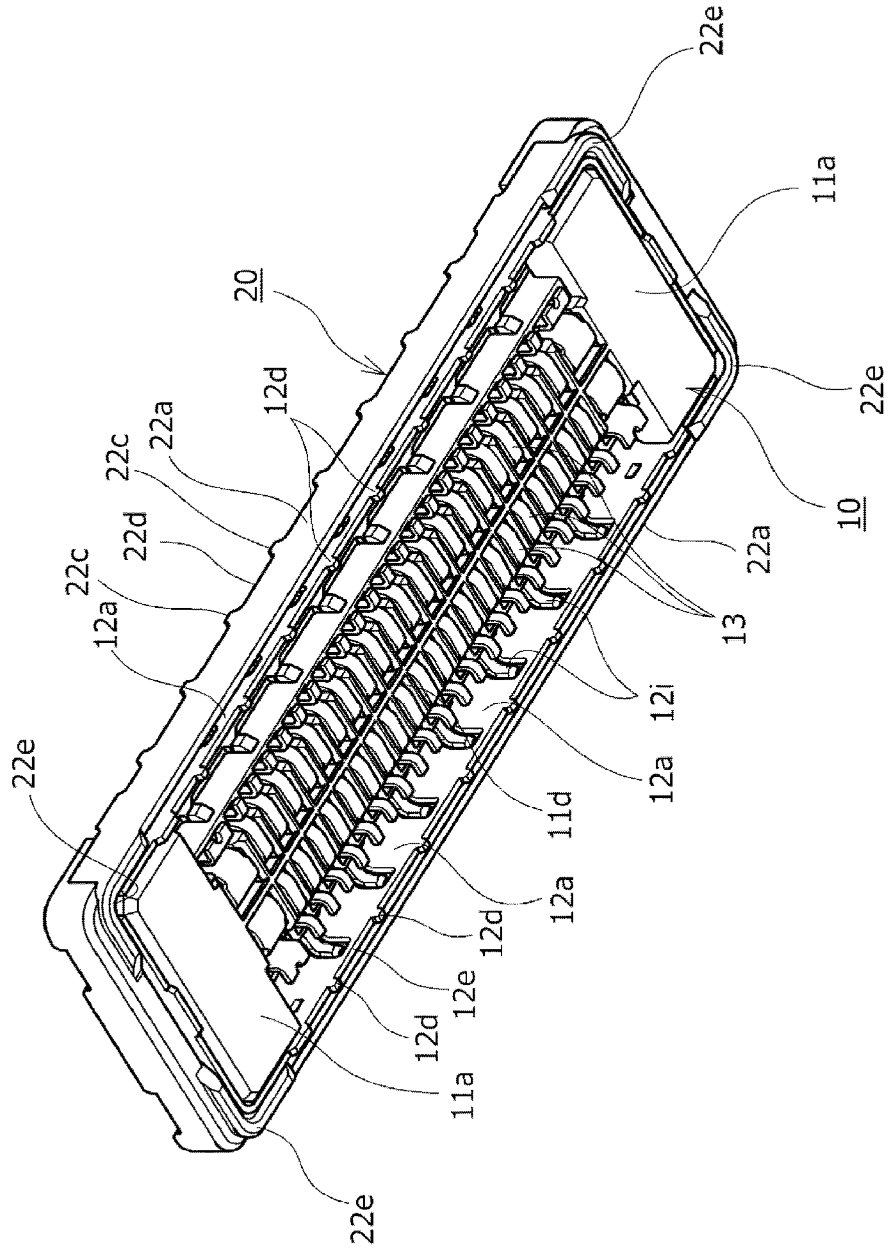
FIG. 20 is an explanatory external perspective view showing, from the lower side, the mutually mated state of the first and second electric connectors shown in FIG. 19.
Figure 21:
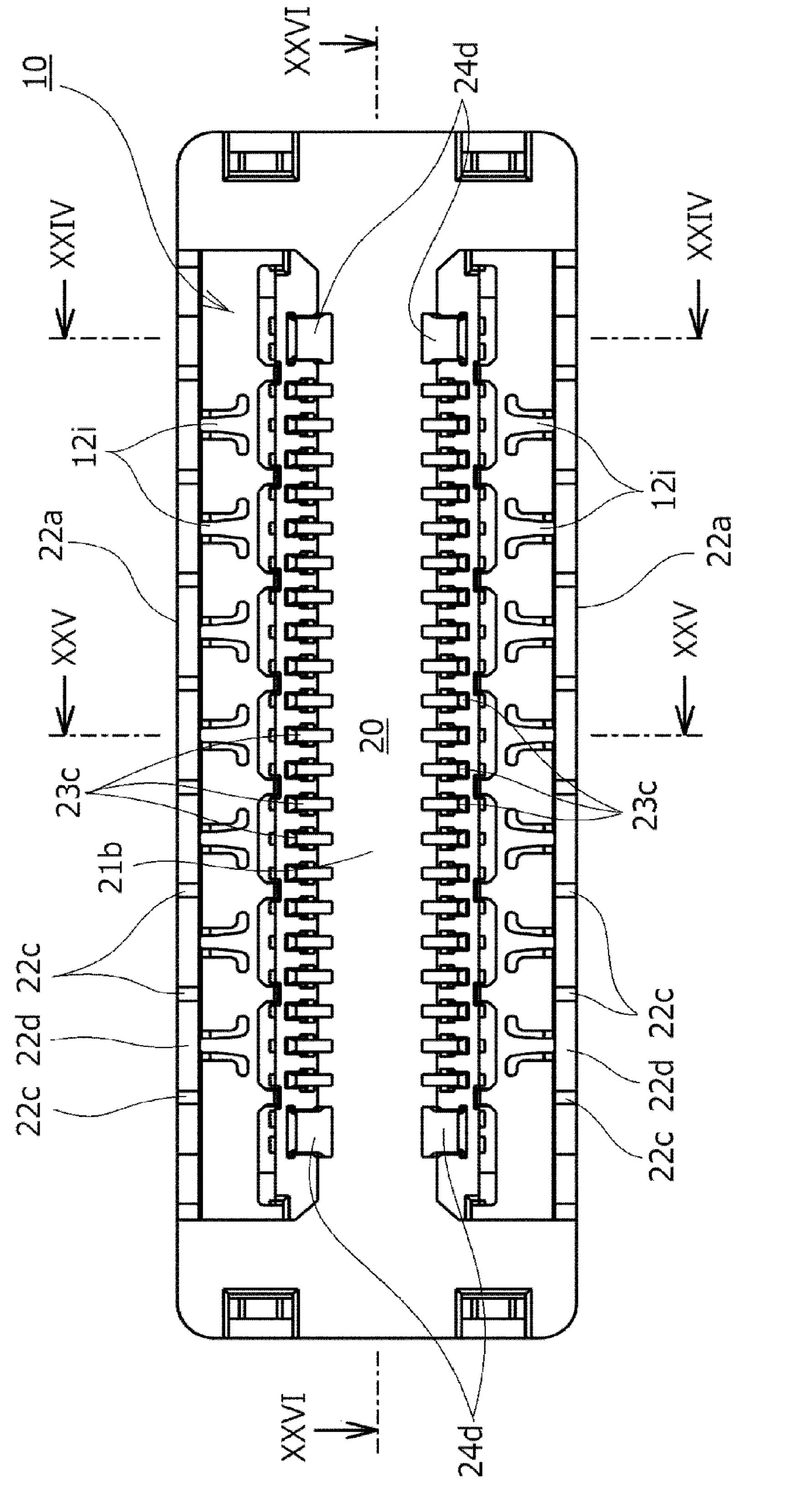
FIG. 21 is an explanatory plan view showing the mutually mated state of the first and second electric connectors shown in FIG. 19 and FIG. 20.
Figure 22:
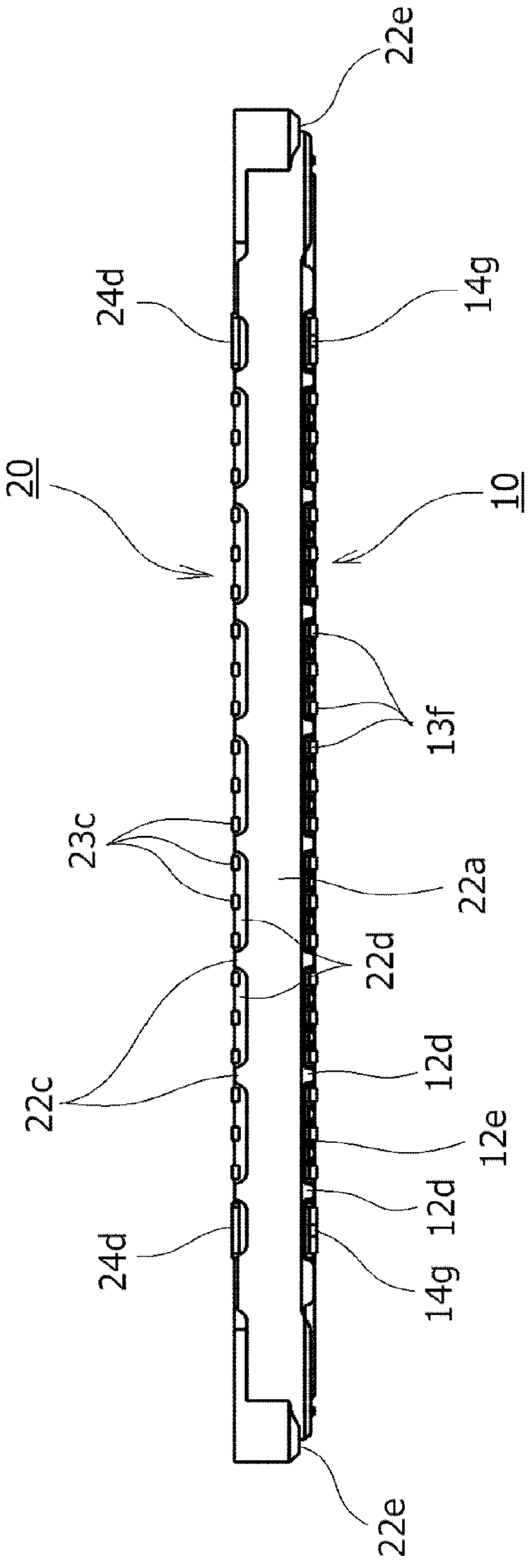
FIG. 22 is an explanatory front view showing the mutually mated state of the first and second electric connectors shown in FIG. 19 and FIG. 20.
Figure 23:
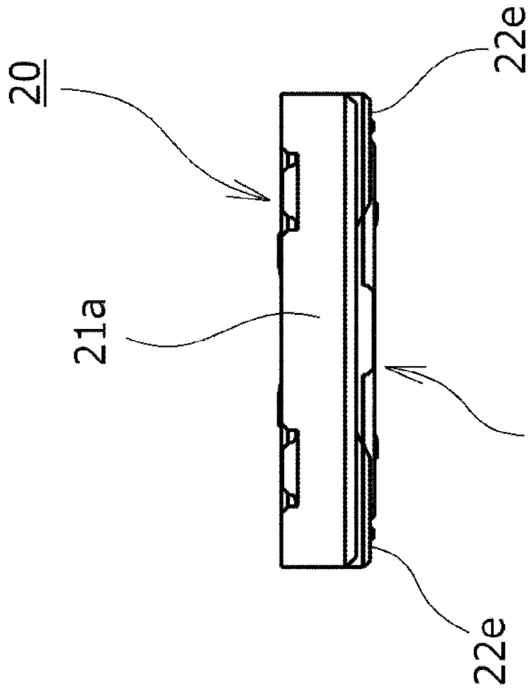
FIG. 23 is an explanatory lateral view showing the mutually mated state of the first and second electric connectors shown in FIG. 19 and FIG. 20.
Figure 24:
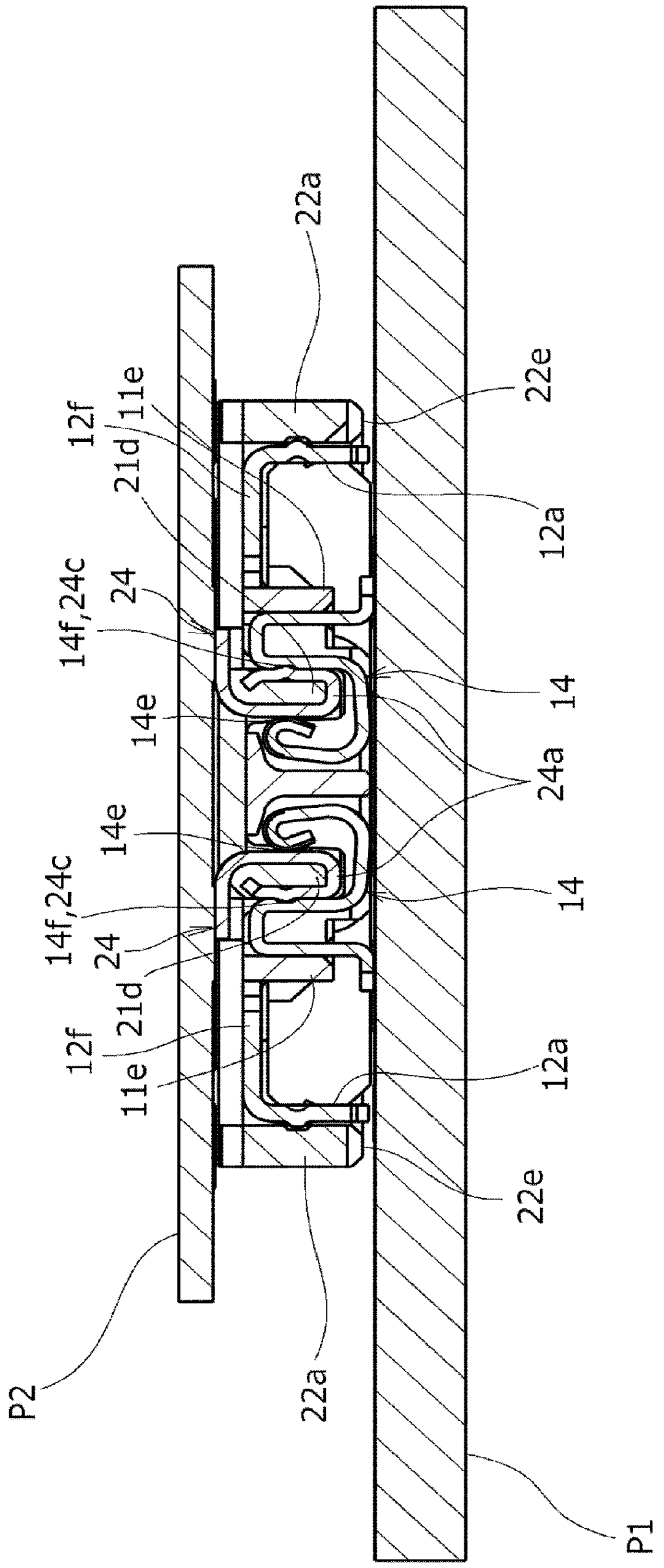
FIG. 24 is an enlarged explanatory transverse-sectional view shown together with wiring boards along a line XXIV-XXIV in FIG. 21.

Particularly as shown in FIG. 9 and FIG. 18, each of these insulating housings 11 and 21 has base end portions 11*a* and 11*a* or 21*a* and 21*a* at both end parts of the insulating housing 11 or 21 in the longitudinal direction (connector longitudinal direction). A central projecting portion 11*b* is provided so as to integrally bridge the connector-width-direction central parts of the base end portions 11*a* and 11*a* to each other in the connector longitudinal direction, and a central recessed portion 21*b* is provided so as to integrally bridge the connector-width-direction central parts of the base end portions 21*a* and 21*a* to each other in the connector longitudinal direction. In this manner, the base end portions 11*a*, 11*a* and 21*a*, 21*a* of the insulating housings 11 and 21 are in the disposition relations in which the base end portions are opposed to each other in the connector longitudinal direction via the central projecting portion 11*b* and the central recessed portion 21*b*, and electrically-conductive shells 12 and 22 are attached so as to bridge the base end portions 11*a* and 11*a* to each other and the base end portions 21*a* and 21*a* to each other.

The electrically-conductive shells 12 and 22 constitute shield wall portions for later-described signal contact members 13 and 14, are formed by bent structures of electrically-conductive members formed of thin-plate-shaped metal members or the like, and are attached so as to surround the outer peripheral parts of the above described insulating housings 11 and 21 and so as to sandwich them from both sides in the connector longitudinal direction and the connector width direction. Herein, the electrically-conductive shells (shield wall portions) 12 attached to the receptacle connector (first electric connector) 10 side are fixed by press-fitting from the upper side with respect to the insulating housing 11; and, on the other hand, the electrically-conductive shells (shield wall portions) 22 attached to the plug connector (second electric connector) 20 side are fixed by insert molding with respect to the insulating housing 21.

Also, at the central projecting portion 11*b* and the central recessed portion 21*b* of the above described insulating housings 11 and 21, contact attachment grooves 11*c* and 21*c*, which form recessed groove shapes, are provided in a recessed manner so as to be juxtaposed at constant intervals along the connector longitudinal direction, and the signal contact members 13 and 23 and power-source contact members 14 and 24 are attached to the contact attachment grooves 11*c* and 21*c* by press-fitting and insert molding, respectively. The signal contact members 13 and 23 among them are arranged at the constant intervals so as to form multipolar shapes along the connector longitudinal direction, and the power-source contact members 14 and 24 are disposed at both-side outer positions of the signal contact members 13 and 23 in the multipolar-shape arrangement direction (connector longitudinal direction).

The overall configuration of the receptacle connector (first electric connector) 10 and the plug connector (second electric connector) 20 is roughly as described above, and the detailed configuration and disposition relation of each part will be described below.

First, each of the signal contact members 13, which are attached to the insulating housing 11 of the receptacle connector (first electric connector) 10 by press-fitting, and the signal contact members 23, which are attached to the insulating housing 21 of the plug connector (second electric connector) 20 by insert molding, has a disposition relation in which two electrode rows extending approximately in parallel along the connector longitudinal direction are formed for the electric connector 10 or 20 thereof. The signal contact members 13 and 13 or the signal contact members 23 and 23 constituting the two electrode rows have a disposition relation so as to be symmetrically opposed to each other in the connector width direction. The below description describes the signal contact members 13 and 13 and the signal contact members 23 and 23, which have such symmetrical disposition relations, as the same without distinguishing them.

[About Contact Members of Receptacle Connector]

Figure 7:
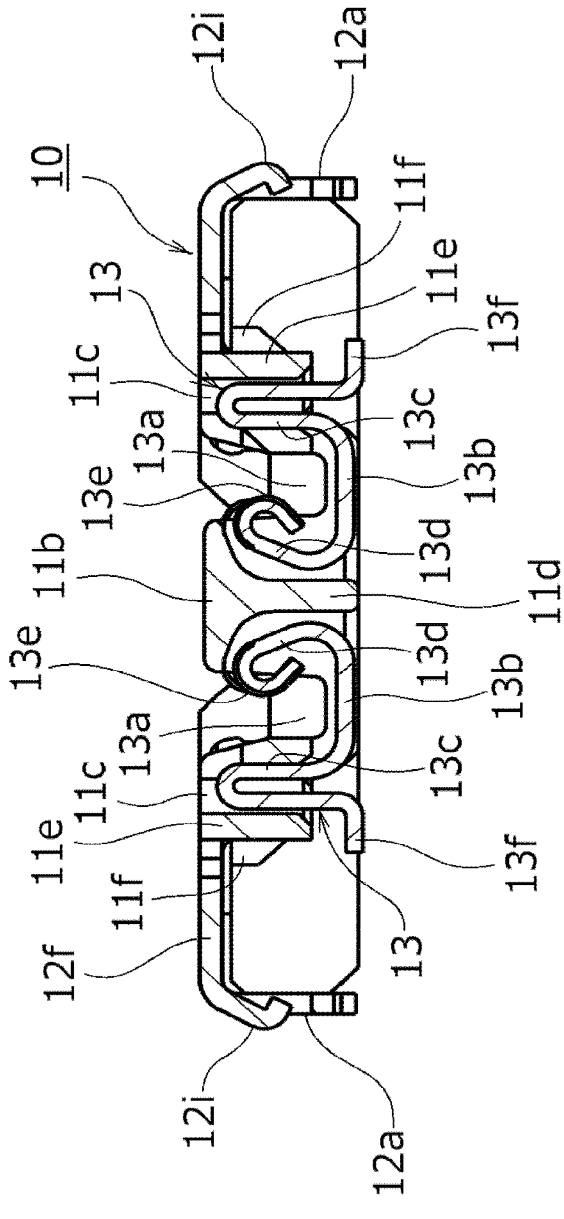
FIG. 7 is an enlarged explanatory transverse-sectional view taken along a line VII-VII in FIG. 3.
Figure 8:
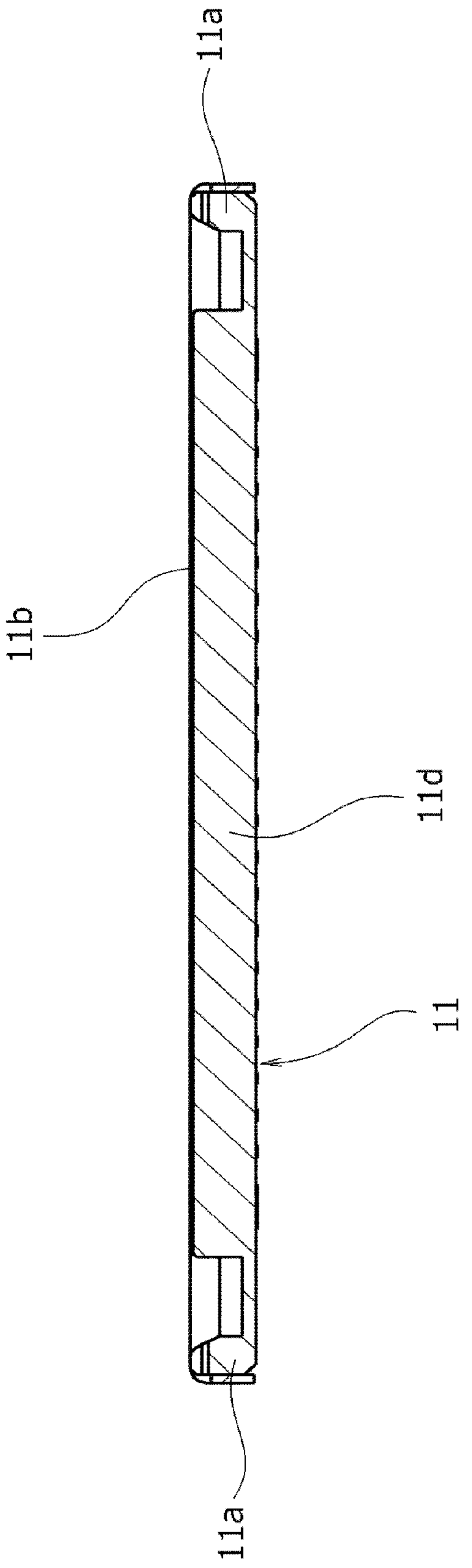
FIG. 8 is an explanatory transverse-sectional view taken along a line VIII-VIII in FIG. 3.

More specifically, first, particularly as shown in FIG. 7, at the central projecting portion 11*b* of the insulating housing 11 to which the signal contact members 13 of the receptacle connector (first electric connector) 10 side are attached, a partition plate 11*d* projecting from a bottom surface plate toward the upper side is provided in the part between the above described two electrode rows, in other words, at a connector-width-direction central part so as to form a band plate shape and extend along the connector longitudinal direction. This partition plate 11*d* constitutes the groove bottom parts of the above described contact attachment grooves 11*c*, and, in the spatial parts between the partition plate 11*d* and the longitudinal lateral wall portions 11*e* and 11*e*, which are provided to stand in the connector-width-direction both sides of the partition plate 11*d*, the pair of the signal contact members 13 and 13 constituting the electrode rows in both sides is disposed in a positional relation in which they are opposed to each other so as to form symmetrical shapes in the connector width direction.

Each of these signal contact members 13 is formed by a band-plate-shaped member made of metal which is bent so as to extend to form a curved shape from the connector central side toward the outer side in the connector width direction, and the signal contact member 13 is attached to the above described contact attachment groove 11*c* by press-fitting from the lower side. The signal contact member 13 is formed so that a mating recessed portion 13*a*, which is bent and formed so as to extend in an approximately U-shape, is hollowed so as to form a recessed shape at a connector central-side part close to the above described partition plate 11*d;* and part of the signal contact member 23 of the plug connector (second electric connector) 20, which is a mating counterpart, is configured to be inserted in and received by the inner space of the mating recessed portion 13*a* from the upper side.

More specifically, the mating recessed portion 13*a* of the signal contact member 13 extending to form the approximately U-shape in the above described manner has an outer rising side portion 13*c* and an inner rising side portion 13*d*, which rise toward the upper side from both sides of a bottom side portion 13*b* extending in the connector width direction. Among the inner/outer both-side rising side portions 13*c* and 13*d*, the outer rising side portion 13*c*, which is disposed in the outer side in the connector width direction, is caused to be in a fixed state by press-fitting from the lower side into the contact attachment groove 11*c*, which is provided in a recessed manner in the above described longitudinal lateral wall portion 11*e*, The above described bottom side portion 13*b* is extending in a cantilever shape from the outer rising side portion 13*c*, which is in the fixed state, toward the connector central side (inner side), and the inner rising side portion 13*d* is also extending in a cantilever shape via the bottom side portion 13*b*, The inner rising side portion 13*d* is disposed so as to be close to the partition plate 11*d* in the connector central side and is configured to be elastically displaceable in the connector width direction with respect to the outer rising side portion 13*c*, which is in the fixed state as described above.

The upper end part of the inner rising side portion 13*d*, which is disposed in the connector central side, has undergone bend forming so as to extend to form a curved shape toward the inner space of the above described mating recessed portion 13*a*, and a projection-shaped contact portion 13*e* is formed at a part of the curved-shape bent part that is bulging to the inner space of the mating recessed portion 13*a*, The projection-shaped contact portion 13*e* is configured to have a relation in which, when part of the signal contact member 23 of the plug connector (second electric connector) 20 is inserted in the inner space of the mating recessed portion 13*a* in the above described manner, the projection-shaped contact portion 13*e* contacts and is electrically connected to the part of the signal contact member 23. This point will be described in detail later.

Figure 25:
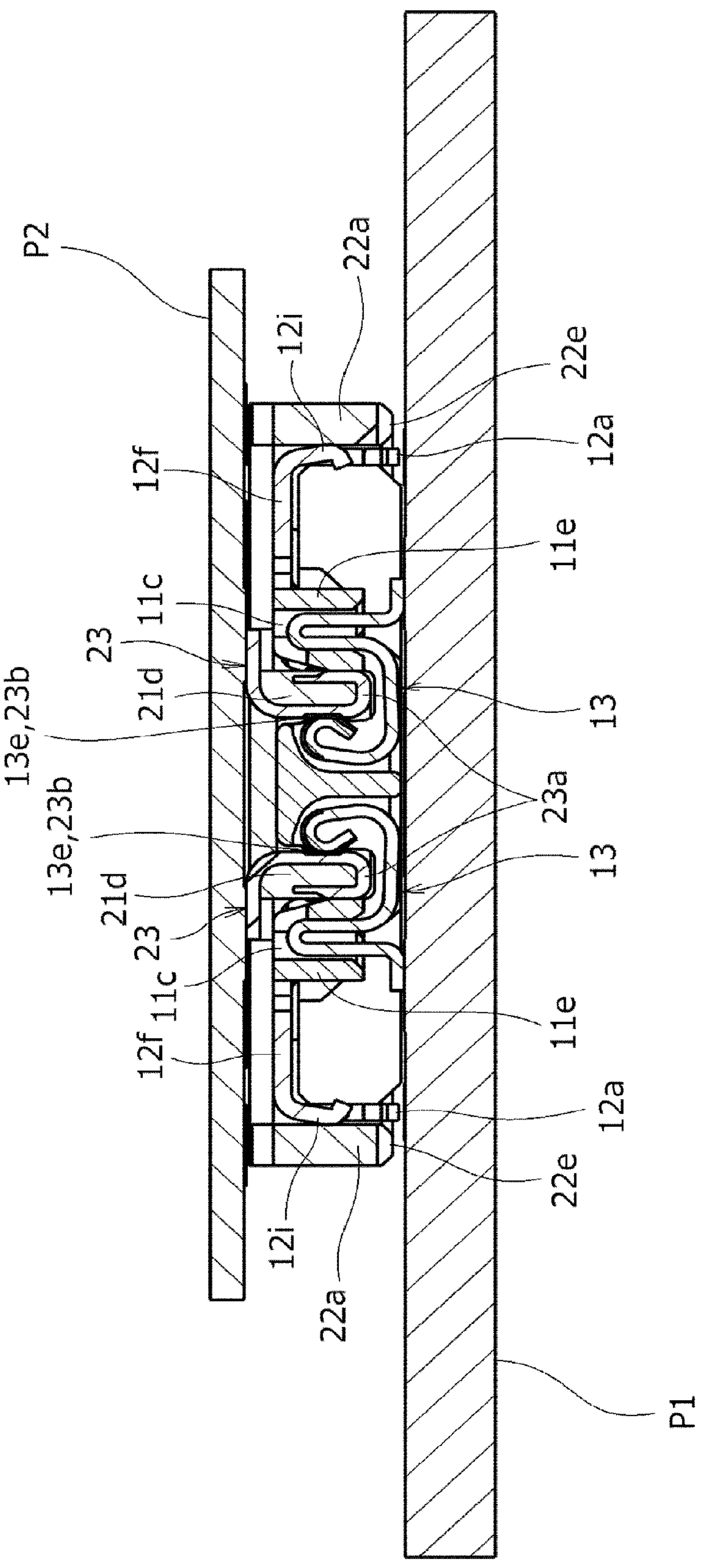
FIG. 25 is an enlarged explanatory sectional view shown together with the wiring board along a line XXV-XXV in FIG. 21.
Figure 26:
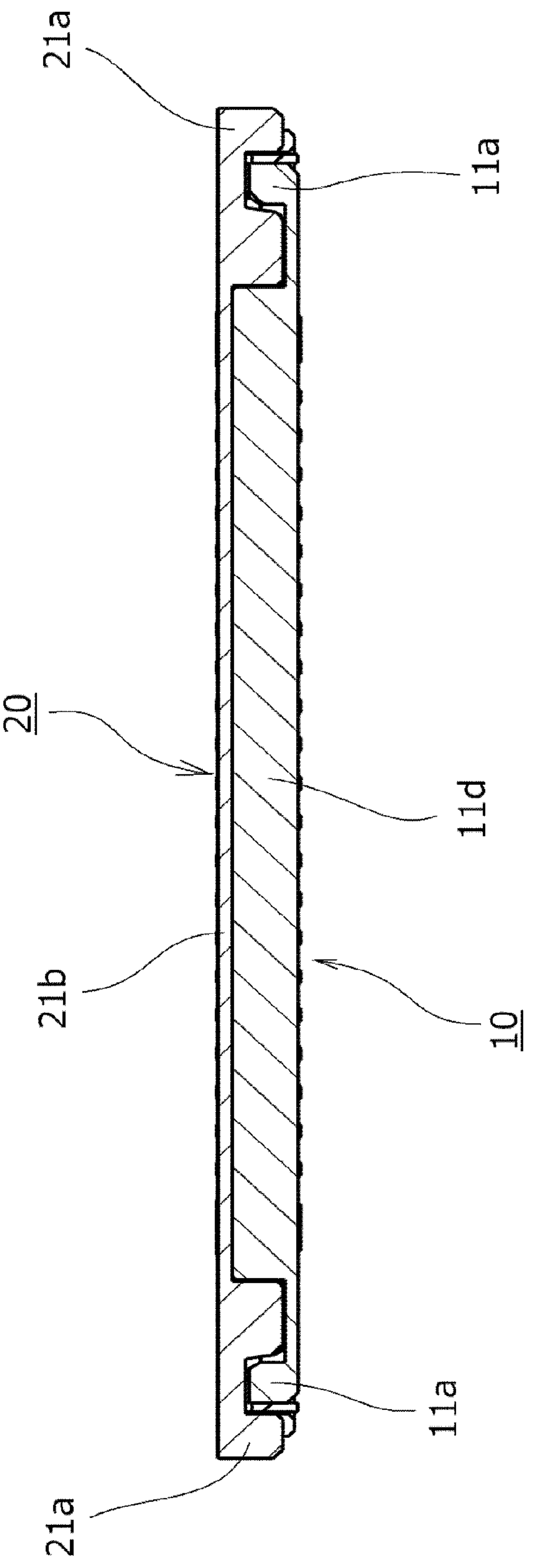
FIG. 26 is an explanatory transverse-sectional view shown together with the wiring boards along a line XXVI-XXVI in FIG. 21.

On the other hand, the outer rising side portion 13*c*, which is disposed in the connector outer side, is caused to be in an insulated state in which the outer rising side portion 13*c* is inserted and buried in the longitudinal lateral wall portion 11*e* in the above described manner. In other words, as shown in FIG. 25, without electrically contacting the signal contact member 23 of the plug connector (second electric connector) 20, which is the mating counterpart, the inner surface of the longitudinal lateral wall portion 11*e* is configured to contact and be pressed against part of the signal contact member 23, which is inserted in the inner space of the mating recessed portion 13*a*.

In this manner, the signal contact members 13 of the receptacle connector (first electric connector) 10 are configured so that the projection-shaped contact portion 13*e* at each location is provided for each of the mating recessed portions 13*a* of the signal contact members 13, and signal transmission with respect to the signal contact member 23 of the plug connector (second electric connector) 20 is configured to be carried out via the projection-shaped contact portion 13*e*, which is provided at each location for each of the signal contact members 13.

Figure 30:
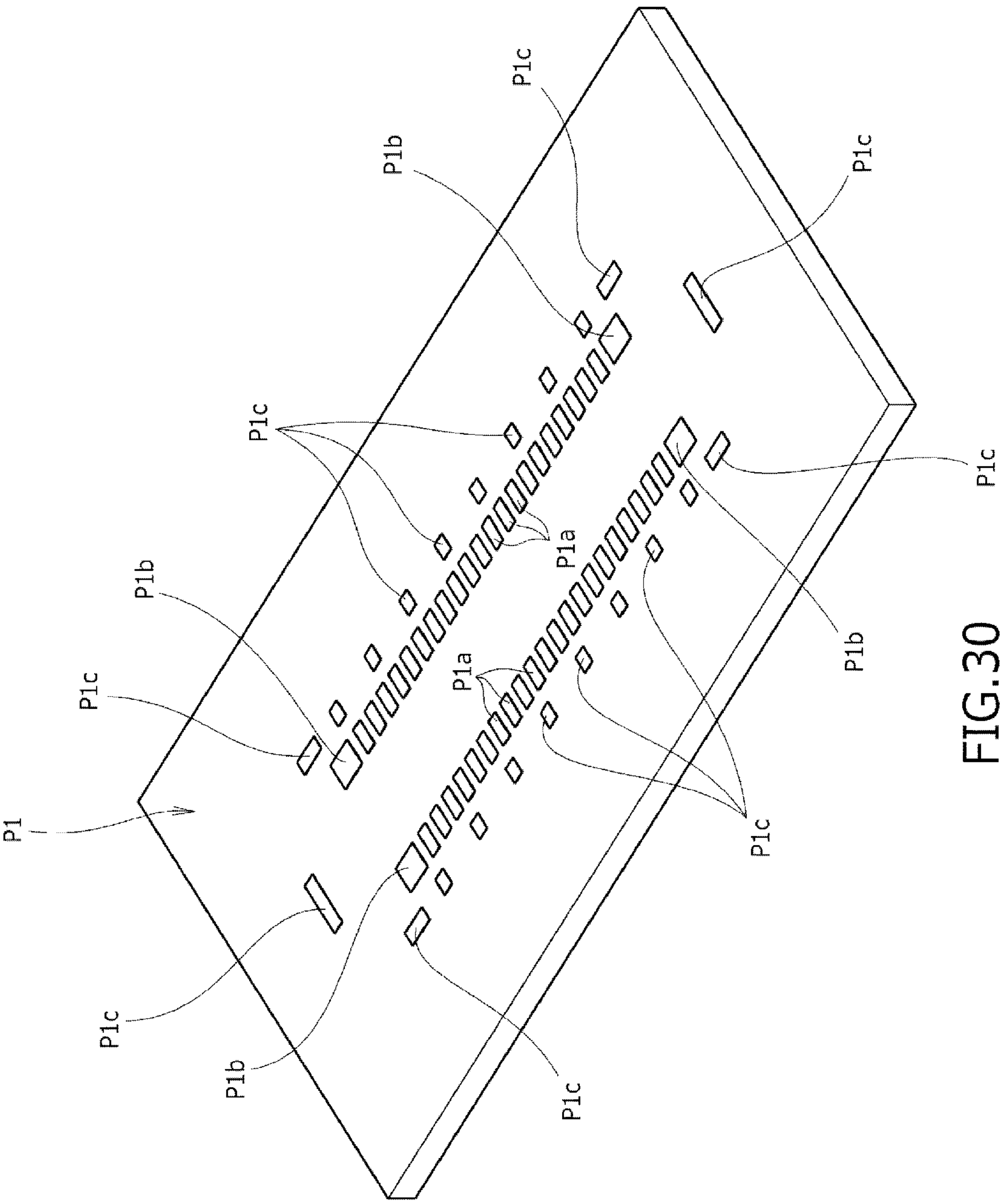
FIG. 30 is an explanatory external perspective view showing a structure example of a printed wiring board on which the first electric connector (receptacle connector) is to be mounted.

Also, the outer rising side portion 13*c* of the signal contact member 13 like this is raised from the above described bottom side portion 13*b* to the upper-surface position of the receptacle connector (first electric connector) 10, bulges toward the connector outer side, is then bent in a reversed U-shape so as to be inverted toward the lower side, and, at the lower-surface position of the receptacle connector 10, is bent again approximately at right angle toward the connector outer side and formed into a board-connecting leg portion (contact connecting portion) 13*f*, The board-connecting leg portion 13*f* is extending approximately horizontally toward the outer side in the connector width direction and is configured to be solder-joined with a signal-transmitting electrically-conductive path (signal pad) P1*a* on the first wiring board P1 particularly as shown in FIG. 30 when the receptacle connector 10 is mounted on the first wiring board P1. The solder joining of the board-connecting leg portions 13*f* is carried out collectively for all the board-connecting leg portions 13*f* by using a solder material having a long shape.

Moreover, at each of the both-side outer positions in the arrangement direction of the multipolar shape of the above described plurality of signal contact members 13 and 13, and so on, the pair of power-source contact members 14 and 14 is attached to the contact attachment grooves 11*c* of the central projecting portion 11*b*. The power-source contact members 14 and 14 basically have similar configurations as the above described signal contact members 13 except the structures of the contact portions and have a disposition relation in which the power-source contact members 14 and 14 are opposed to each other so as to form symmetrical shapes in the connector width direction in the both sides sandwiching the partition plate 11*d*.

Each of these power-source contact members 14 is also formed by a band-plate-shaped member made of metal which is bent so as to form a curved shape and extend from the connector-width-direction connector central side toward the outer side, and, particularly as shown in FIG. 9, a plate-width size W1 of the power-source contact member (or ground contact member) 14 is set to have a size that is several times a plate-width size W2 of the above described signal contact member 13 or more than that (W1>W2).

Figure 6:
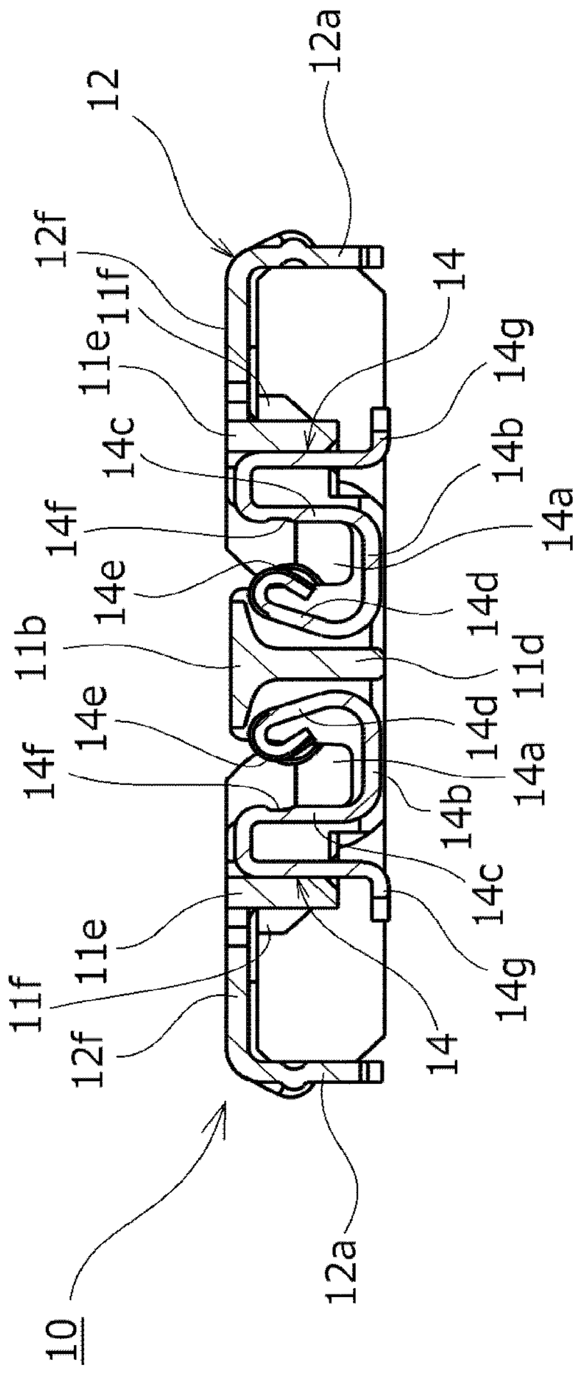
FIG. 6 is an enlarged explanatory transverse-sectional view taken along a line VI-VI in FIG. 3.

Also in the power-source contact member 14 like this, at a connector central-side part close to the above described partition plate 11*d* as shown in FIG. 6, a mating recessed portion 14*a* hollowed to form a recessed shape is bent and formed so as to extend in an approximately U-shape, and part of the power-source contact member 24 of the plug connector (second electric connector) 20, which is the mating counterpart, is configured to be received so as to be inserted from the upper side into the inner space of the mating recessed portion 14*a*.

More specifically, the mating recessed portion 14*a* of the power-source contact member 14 extending to form the approximately U-shape in the above described manner has an outer rising side portion 14*c* and an inner rising side portion 14*d*, which rise toward the upper side from both sides of a bottom side portion 14*b* extending in the connector width direction. Among the inner/outer both-side rising side portions 14*c* and 14*d*, the outer rising side portion 14*c*, which is disposed in the outer side in the connector width direction, is caused to be in a fixed state by press-fitting from the lower side into the contact attachment groove 11*c*, which is provided in a recessed manner in the above described longitudinal lateral wall portion 11*e*. Also, the inner rising side portion 14*d* is extending in a cantilever shape from the outer rising side portion 14*c*, which is in such a fixed state, via the above described bottom side portion 14*b*. The inner rising side portion 14*d* is disposed so as to be close to the partition plate 11*d* in the connector central side and is configured to be elastically displaceable in the connector width direction with respect to the outer rising side portion 14*c*, which is in the fixed state as described above.

The upper end part of the inner rising side portion 14*d*, which is disposed in the connector central side, has undergone bend forming so as to extend to form a curved shape toward the inner space of the above described mating recessed portion 14*a*, and a projection-shaped contact portion 14*e* is formed at a part of the curved-shape bent part that is bulging to the inner space of the mating recessed portion 14*a*. The projection-shaped contact portion 14*e* is configured to have a relation in which, when part of the power-source contact member 24 of the plug connector (second electric connector) 20, which is the mating counterpart, is inserted in the inner space of the mating recessed portion 14*a* in the above described manner, the projection-shaped contact portion 14*e* contacts and is electrically connected to the part of the power-source contact member 24. This point will be described in detail later.

On the other hand, a recess-shaped contact portion 14*f* is formed at an intermediate position of the part in which the outer rising side portion 14*c*, which is disposed in the connector outer side, is extending in the up-down direction. The recess-shaped contact portion 14*f* is configured to contact and be electrically connected to part of the power-source contact member 24 when the part of the power-source contact member 24 of the plug connector (second electric connector) 20, which is the mating counterpart, is inserted in the inner space of the mating recessed portion 14*a* in the above described manner. This point will be also described later in detail.

In this manner, the power-source contact member 14 of the receptacle connector (first electric connector) 10 is configured to be provided with the contact portions at two locations consisting of the projection-shaped contact portion 14*e* and the recess-shaped contact portion 14*f* for the mating recessed portion 14*a* of each of the power-source contact members 14, and supply of power-source currents is configured to be carried out with respect to the power-source contact member 24 of the plug connector (second electric connector) 20, which is the mating counterpart, via the contact portions 14*e* and 14*f* at the two locations.

Also, the outer rising side portion 14*c* of the above described power-source contact member 14 is raised to the upper-surface position of the receptacle connector (first electric connector) 10, is then bent so as to be inverted toward the lower side while bulging toward the connector outer side, and, at the lower-surface position of the receptacle connector 10, is bent approximately at right angle toward the connector outer side and formed into a board-connecting leg portion (contact connecting portion) 14*g*. The board-connecting leg portion 14*g* is extending approximately horizontally toward the outer side in the connector width direction and is configured to be solder-joined with a power-supplying electrically-conductive path (signal pad) P1*b* on the first wiring board P1 in a case of mounting of the receptacle connector 10. The solder-joining of the board-connecting leg portions 14*g* is carried out collectively for all the board-connecting leg portions 14*g* by using a solder material having a long shape.

[About Contact Members of Plug Connector]

Next, the central recessed portion 21*b* of the insulating housing 21 of the plug connector (second electric connector) 20 has a pair of longitudinal lateral wall portions 21*d* and 21*d* extending approximately in parallel along the connector longitudinal direction (multipolar-shape arrangement direction), and the signal contact members 23 and the power-source contact members 24 are attached to the contact attachment grooves 21*c* having recessed groove shapes, which are arranged at constant intervals along the connector longitudinal direction of the longitudinal lateral wall portions 21*d*, by insert molding so as to constitute two electrode rows. The signal contact members 23 and the power-source contact members 24 constituting the two electrode rows are in a disposition relation in which they are symmetrically opposed to each other in the connector width direction.

Figure 15:
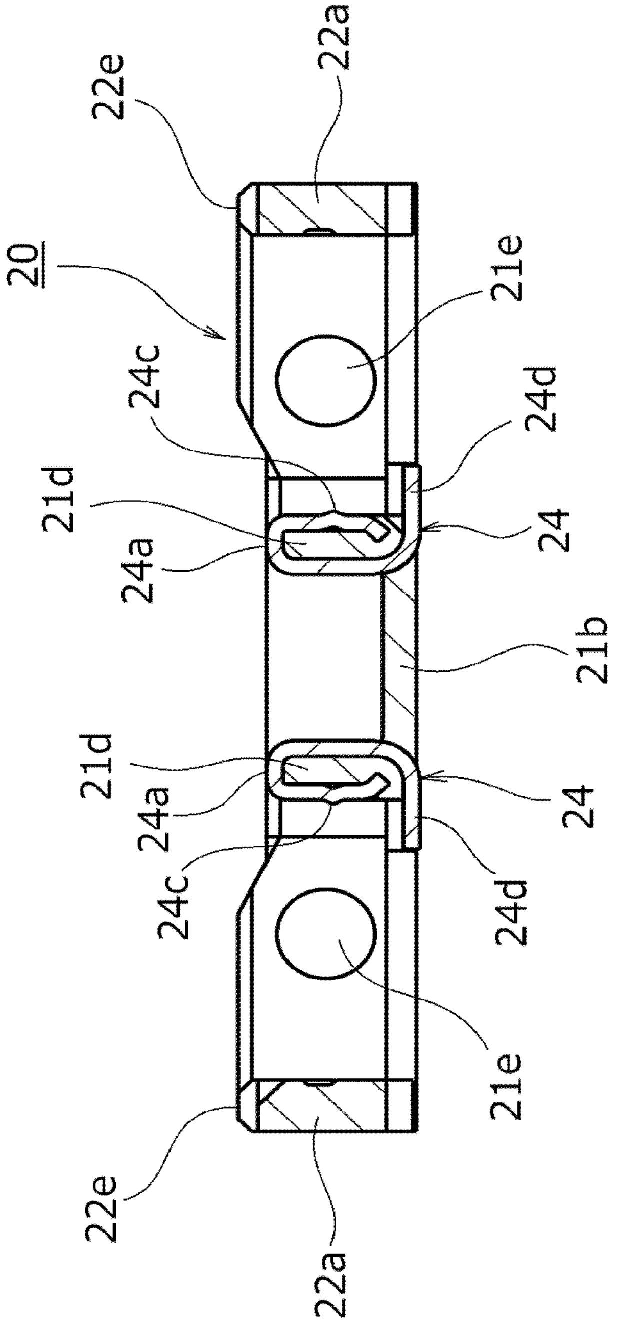
FIG. 15 is an enlarged explanatory transverse-sectional view taken along a line XV-XV in FIG. 12.
Figure 16:
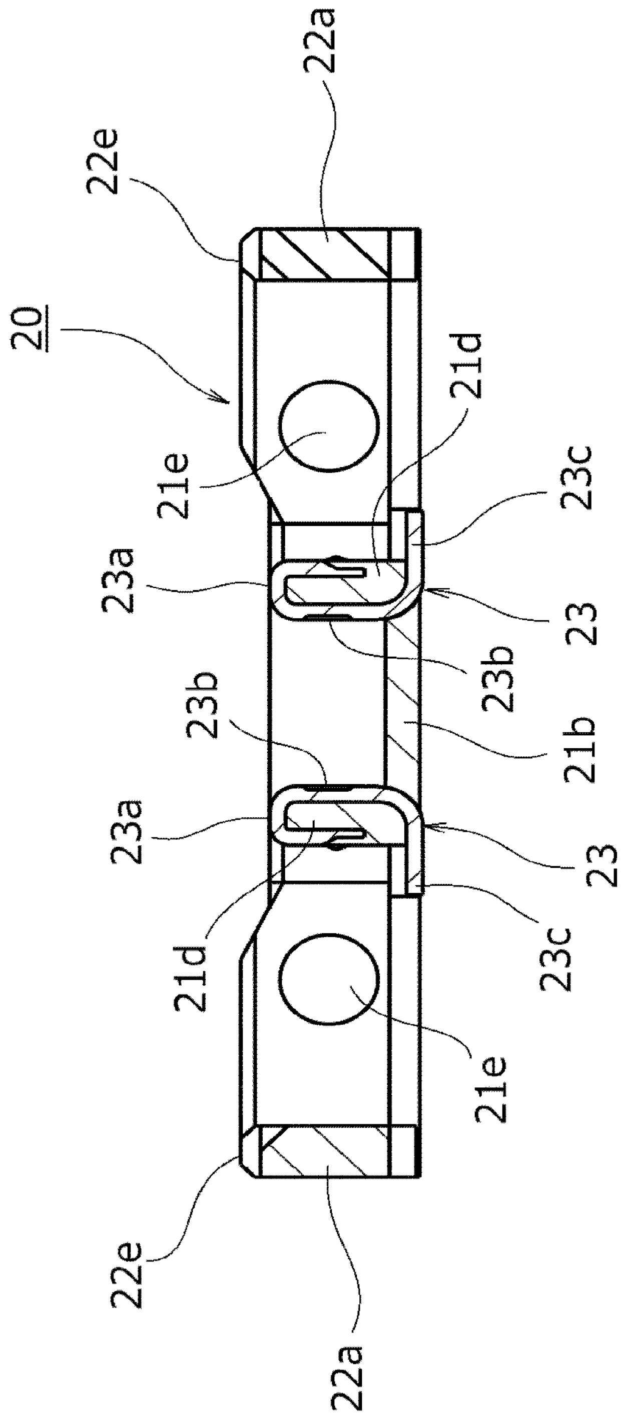
FIG. 16 is an enlarged explanatory transverse-sectional view taken along a line XVI-XVI in FIG. 12.
Figure 17:
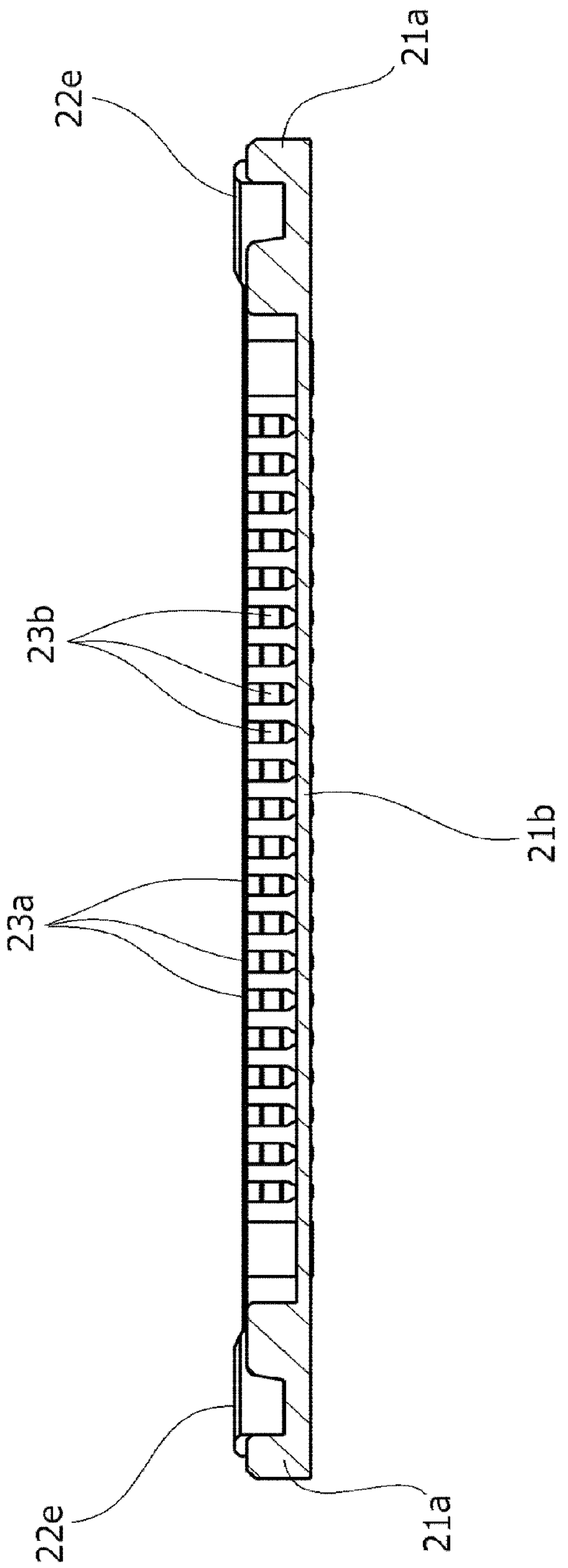
FIG. 17 is an explanatory transverse-sectional view taken along a line XVII-XVII in FIG. 12.

More specifically, at the central recessed portion 21*b* of the insulating housing 21 to which the signal contact members 23 and the power-source contact members 24 are attached, particularly as shown in FIG. 15 and FIG. 16, the part between the above described two electrode rows, in other words, the part between the longitudinal lateral wall portions 21*d* and 21*d* in both sides is formed into a recess-shaped space extending in the connector longitudinal direction, and the signal contact members 23 and the power-source contact members 24 are attached so as to be wound around the outer peripheral side of the longitudinal lateral wall portions 21*d*. Each pair of the signal contact members 23 and 23 and each pair of the power-source contact members 24 and 24 constituting the electrode rows of the both sides are disposed in a positional relation in which they are opposed to each other so as to form symmetrical shapes in the connector width direction.

Each of the signal contact members 23 and the power-source contact members 24 is formed by a band-plate-shaped member made of metal which is bent so as to form a curved shape of a reversed U-shape and extend so as to cover upper edge portions of the above described longitudinal lateral wall portions 21*d*, and, particularly as shown in FIG. 18, the plate-width size W3 of the power-source contact member 24 is set to have a size that is several times the plate-width size W4 of the signal contact member 23 or larger than that (W3>W4).

In this manner, in the present embodiment, the width size W1 or W3 of the band-plate-shaped members constituting the power-source contact member 14 or 24 is formed to be larger than the width size W2 or W4 of the band-plate-shaped member constituting the signal contact member 13 or (W1, W3>W2, W4). Therefore, the mating retention force by the power-source contact member 14 or 24 is configured to be higher compared with the signal contact member 13 or 23.

Particularly, in the present embodiment, since the power-source contact members 14 and 24 having the large mating retention force compared with the signal contact members 13 and 23 are configured to be disposed at four corners in a planar view of the electric connector device, the power-source contact members 14 and 24 have functions as simple lock mechanisms about mating of both of the electric connectors 10 and 20.

In each of the signal contact members 23 and the power-source contact members 24, the part that forms a reversed U-shape and projects to the upper side is formed into a mating projection portion 23*a* or a mating projection portion 24*a*. The mating projection portions 23*a* and the mating projection portions 24*a* are configured to be inserted from the upper side into the mating recessed portions 13*a* and the mating recessed portions 14*a*, which are provided in the signal contact members 13 and the power-source contact members 14 of the receptacle connector (first electric connector) 10, which is a mating counterpart, and to be received when the signal contact members 13 and the power-source contact members 14 are elastically displaced.

Herein, the mating projection portions 23*a* and the mating projection portions 24*a*, which form the reversed U-shapes in the above described signal contact members 23 and the power-source contact members 24 have connector-central-side inner wall surfaces and connector-outer-side outer wall surfaces extending approximately in parallel in the up-down direction; and, among both of the connector inner/outer wall surfaces, on each of the inner wall surfaces of the mating projection portions 23*a*, a recess-shaped contact portion 23*b* is formed. The recess-shaped contact portions 23*b* of the plug connector 20 side are configured to elastically contact and be electrically connected to the projection-shaped contact portions 13*e* of the receptacle connector 10 side when both of the electric connectors 10 and 20 are mated with each other, wherein the mating projection portions 23*a* and 24*a* of the signal contact members 23 and the power-source contact members 24 provided in the plug connector (second electric connector) 20 are inserted in the inner spaces of the mating recessed portions 13*a* and 14*a* of the signal contact members 13 and the power-source contact members 14 provided in the above described receptacle connector (first electric connector) 10.

On the other hand, the outer wall surface of the mating projection portion 23*a* provided in the signal contact member 23 is extending to form a flat surface shape. As shown in FIG. 25, the outer wall surface of the mating projection portion 23*a*, which is provided so as to form the flat surface shape in the plug connector 20 side, is configured to be brought into a state in which it contacts and is pressed against the inner wall surface of the longitudinal lateral wall portion 11*e*, which is provided in the insulating housing 11 in the above described receptacle connector (first electric connector) 10 side, from the connector central side, thereby achieving an insulated state in which electrical connection is not established when both of the electric connectors 10 and 20 are mated with each other, wherein the mating projection portion 23*a* of the signal contact member 23 provided in the plug connector (second electric connector) 20 is inserted in the inner space of the mating recessed portion 13*a* of the signal contact member 13, which is provided in the above described receptacle connector (first electric connector) 10.

In this manner, in the present embodiment, when both of the electric connectors 10 and 20 are mated with each other, the projection-shaped contact portion 13*e* of the signal contact member 13 is structured to be pressed against the recess-shaped contact portion 23*b* of the plug connector 20 side, which is the mating counterpart, by part of the insulating housing 11 in which the signal contact member 13 of the receptacle connector (first electric connector) 10 is sandwiched. Therefore, the electric connectivity of the contact portion is enhanced, and impedance matching of signal transmission utilizing the dielectric property of the insulating housing 11 can be expected.

Meanwhile, the signal contact members 13 and 23 provided in the above described both electric connectors 10 and 20 are configured to be electrically connected to each other only by the contact portion at a single location consisting of the projection-shaped contact portion 13*e* and the recess-shaped contact portion 23*b* disposed in the connector central side, and signal transmission is configured to be carried out via the contact portion at the single location.

On the other hand, a projection-shaped contact portion 24*c* is formed at an intermediate position of the up-down-direction extension of the connector outer lateral wall surface of the mating projection portion 24*a* provided in the power-source contact member 24. The projection-shaped contact portion 24*c* of the plug connector 20 side is configured to be in a relation in which it contacts and is electrically connected to the recess-shaped contact portion 14*f* provided in the power-source contact member 14 of the receptacle connector (first electric connector) 10 side when both of the electric connectors 10 and 20 are mated with each other, and, as a result, the mating projection portion 23*a* of the signal contact member 23 provided in the plug connector (second electric connector) 20 is inserted in the inner space of the mating recessed portion 13*a* of the signal contact member 13 provided in the above described receptacle connector (first electric connector) 10.

In this manner, the power-source contact members 14 and 24 respectively provided in both of the electric connectors 10 and 20 are configured to be electrically connected to each other via the contact portions at two locations composed of the inner-side contact portion, which is composed of the projection-shaped contact portion 14*e* and the flat surface portion disposed in the connector central side, and the outer side contact portion, which is composed of the recess-shaped contact portion 14*f* and the projection-shaped contact portion 24*c* disposed in the connector outer side, and power-source currents are configured to be supplied via the contact portions at the two locations.

According to the present embodiment as described above, signal transmission is carried out through the projection-shaped contact portion 13*e* and the recess-shaped contact portion 23*b*, which are provided at one location for the mating recessed portion 13*a* and the mating projection portion 23*a* of the signal contact members 13 and 23. Therefore, particularly interference in high-frequency transmission is reduced, and good transmission characteristics are obtained. On the other hand, the projection-shaped contact portion 14*e* and the flat surface portion provided in the mating recessed portion 14*a* and the mating projection portion 24*a* of the power-source contact members (or ground contact members) 14 and 24 are brought into a mutually contacted state, and the projection-shaped contact portion 24*c* and the recess-shaped contact portion 14*f* are brought into a mutually contacted state, and, therefore, sufficient mating retention force is obtained.

Figure 31:
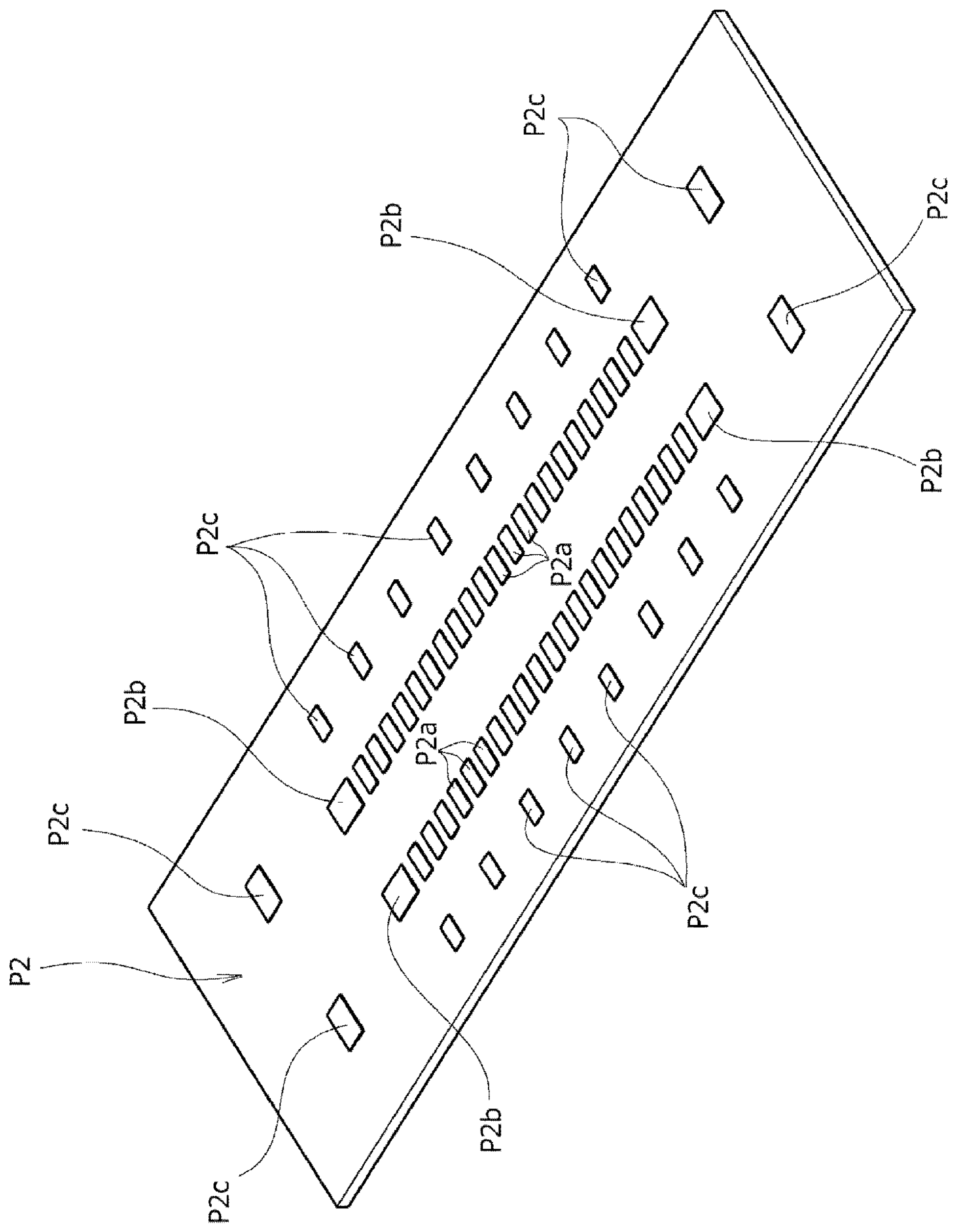
FIG. 31 is an explanatory external perspective view showing a structure example of a printed wiring board on which the second electric connector (plug connector) is to be mounted.

Meanwhile, the lower end parts of the inner wall surfaces of the mating projection portions 23*a* and 24*a* provided in the above described signal contact member 23 and the power-source contact member (or ground contact member) 24 are bent at approximately right angle at the lower-surface position of the plug connector 20 toward the connector outer side and are formed into board-connecting leg portions (contact connecting portions) 23*c* and 24*d* . The board-connecting leg portions 23*c* and 24*d* are extending approximately horizontally toward the connector-width-direction outer side and are configured so as to be solder-joined with signal-transmitting electrically-conductive paths (signal pads) P2*a* and a power-supplying electrically-conductive paths (power-source pads) P2*b* on the second wiring board P2 particularly as shown in FIG. 31 in a case of mounting of the plug connector 20. The solder-joining of the board-connecting leg portions 23*c* and 24*d* is collectively carried out with respect to all the board-connecting leg portions 23*c* and 24*d* by using a solder material having a long shape.

[About Electrically-Conductive Shells of Receptacle Connector]

Next, the electrically-conductive shells 12 provided as the shield wall portions in the receptacle connector (first electric connector) 10 side are formed by a frame-shaped structure divided into two bodies and are attached to the insulating housing 11 in a state in which they are disposed to be opposed so as to face each other. More specifically, each of the pair of electrically-conductive shells (shield wall portions) 12 and 12 is formed by a thin-plate-shaped metal bent member which forms an approximately L-shape in a planar view, the longitudinal lateral wall plate 12*a* constituting the long-side part of the shape which is approximately L-shaped in a plane in the electrically-conductive shell 12 is disposed so as to extend along the connector longitudinal direction, and the short-side lateral wall plate 12*b* constituting the short-side part of the shape which is approximately L-shaped in a plane is disposed so as to extend along the connector width direction. The longitudinal lateral wall plates 12*a* and 12*a* and the short-side lateral wall plates 12*b* and 12*b* constituting the pair of electrically-conductive shells 12 and 12 are disposed in a state in which they are opposed to each other approximately in parallel, and, as a result of such an opposed disposition relation, the frame structure which forms an approximately rectangular shape as an overall shape in a planar view is formed.

Herein, on an upper edge part of the short-side lateral wall plate 12*b* of the electrically-conductive shell (shield wall portion) 12, a pair of fixation latch pieces 12*c* and 12*c* are provided with a predetermined interval therebetween. Each of the fixation latch pieces 12*c* constitutes an auxiliary cover as described later, is bent so as to bulge from the upper edge part of the short-side lateral wall plate 12*b* toward the connector central side (inner side), and is then formed into a bent curved shape of a reversed U-shape, which is inverted toward the lower side. When both of the fixation latch pieces 12*c* and 12*c* are subjected to press-fitting from the upper side with respect to the base end portion 11*a* of the above described insulating housing 11, the entire electrically-conductive shell 12 is brought into a fixed state with respect to the insulating housing 11.

On the other hand, on the lower edge portions of the longitudinal lateral wall plates 12*a* and the short-side lateral wall plates 12*b* of the electrically-conductive shells (shield wall portions) 12, a plurality of ground connecting portions 12*d* composed of plate-shaped protruding pieces which project to the lower side toward the surface of the first wiring board P1 are formed. The plate-shaped protruding pieces constituting the ground connecting portions 12*d* are formed so as to be continuous to have the surfaces which are flat to the longitudinal lateral wall plate 12*a* or the short-side lateral wall plate 12*b* and are extending in the plate thickness of the longitudinal lateral wall plate 12*a* or the short-side lateral wall plate 12*b*.

In this manner, in the receptacle connector (first electric connector) 10 according to the present embodiment, the ground connecting portions (plate-shaped protruding pieces) 12*d* of the electrically-conductive shells (shield wall portions) 12 are disposed in a state in which they are within the range of the plate thickness of the electrically-conductive shells 12 and are configured so as not to bulge to the outer side of the electrically-conductive shells 12. Therefore, the entire connector can be downsized.

Note that the lower end portions of the above described ground connecting portions 12*d* are electrically connected to ground electrically-conductive paths (ground pads) P1*c*, which are provided on the surface of the first wiring board P1, by solder-joining therewith, and the solder-joining of the ground connecting portions 12*d* in that case is collectively carried out for all of the ground connecting portions 12*d* by using a solder material having a long shape.

Since the electrically-conductive shells (shield wall portions) 12 composed of the frame structures having such an approximately rectangular shape in the plane are formed so as to surround the entire outer periphery of the insulating housing 11, electromagnetic shielding with respect to the signal contact members 13 attached to the insulating housing 11 is carried out.

Particularly, there is a disposition relation that, at the positions having predetermined intervals in the connector width direction from the board-connecting leg portions (contact connecting portions) 13*f* of the above described signal contact members 13, the longitudinal lateral wall plates 12*a* of the electrically-conductive shells (shield wall portions) 12 are provided to stand on the surface of the first wiring board P1. More specifically, since the longitudinal lateral wall plates 12*a* of the electrically-conductive shells 12 are opposed to the outer end surfaces of the board-connecting leg portions 13*f* of the signal contact members 13 and are extending in the connector longitudinal direction (multipolar-shape arrangement direction), the electromagnetic shielding with respect to the entire signal contact members 13 including the board-connecting leg portions 13*f* is configured to be carried out well in a state in which impedance matching is appropriately carried out via the spatial parts between the above described board-connecting leg portions 13*f* and the longitudinal lateral wall plates 12*a* of the electrically-conductive shells 12.

[About Lateral Check Window]

Meanwhile, the plurality of ground connecting portions (plate-shaped protruding pieces) 12*d* provided on the longitudinal lateral wall plates 12*a* of the above described electrically-conductive shells (shield wall portions) 12 are disposed at constant intervals in the connector longitudinal direction (multipolar-shape arrangement direction), and, in the region of the interval between the pair of ground connecting portions 12*d* and 12*d*, which are adjacent to each other in the connector longitudinal direction, a lateral check window 12*e* composed of the space which enables visual check of the board-connecting leg portions (contact connecting portions) 13*f* of the signal contact member 13 in the connector width direction is formed.

More specifically, the ground connecting portions 12*d* provided in the electrically-conductive shells (shield wall portions) 12 are in a disposition relation in which the installation positions thereof in the connector longitudinal direction are shifted with respect to the board-connecting leg portions (contact connecting portions) 13*f* of the signal contact members 13, and there is a relation that the ground connecting portion 12*d* is disposed in the part between the board-connecting leg portions 13*f* and 13*f* which are adjacent to each other in the connector longitudinal direction. In the part between the pair of ground connecting portions 12*d* and 12*d* which are adjacent to each other in the connector longitudinal direction, a laterally-long spatial part formed by the ground connecting portions 12*d* and 12*d* and the lower edge portion of the longitudinal lateral wall plate 12*a* of the electrically-conductive shell 12 is formed, and the laterally-long spatial part is formed into the above described lateral check window 12*e*.

The connector-longitudinal-direction length of the lateral check window 12*e* according to the present embodiment is formed to correspond to the length in which the plurality (three) of board-connecting leg portions (contact connecting portions) 13*f* are juxtaposed. In a case in which an assembly operator carries out a visual check toward the connector width direction through the lateral check window 12*e*, the end faces of the plurality (three) of board-connecting leg portions 13*f* are configured to be visually checked in the inner region of the lateral check window 12*e*.

[About Planar Cover]

Furthermore, a planar cover 12*f*, which is approximately horizontally extending, is continued to the upper edge part of the longitudinal lateral wall plate 12*a* of the above described electrically-conductive shell (shield wall portion) 12. The planar cover 12*f* is formed so as to be bent approximately at right angle from the upper edge portion of the longitudinal lateral wall plate 12*a* toward the connector central side (inner side) and is extending approximately horizontally so as to cover, from the upper side, the spatial part which is formed from the longitudinal lateral wall plate 12*a* to the vicinities of the distal ends of the board-connecting leg portions (contact connecting portions) 13*f* of the signal contact members 13.

In this manner, according to the present embodiment, the electromagnetic shielding function with respect to the board-connecting leg portions (contact connecting portions) 13*f* of the signal contact members 13 is obtained well by the electrically-conductive shells (shield wall portions) 12. Particularly, since the electrically-conductive shells 12 of the receptacle connector (first electric connector) 10 according to the present embodiment are provided with the planar covers 12*f*, which cover the upper surface of the insulating housing 11 approximately in parallel with the first wiring board P1, the electromagnetic shielding function with respect to the board-connecting leg portions 13*f* is further enhanced by the planar covers 12*f*.

The pair of planar covers 12*f* is disposed in both sides sandwiching the central projecting portion 11*b* of the insulating housing 11 in the connector width direction so as to be opposed to each other, and a plurality of cover coupling portions 12*g* are provided on the connector-central-side inner edge part of each of the planar covers 12*f* so as have constant intervals in the connector longitudinal direction. Each of the cover coupling portions 12*g* is formed by a plate-shaped protruding piece which is projecting approximately horizontally toward the connector central side, and the cover coupling portions 12*g* are supported so as to be placed on receiving portions 11*f*, which are formed so as to form mount shapes on the longitudinal lateral wall portions 11*e* of the central projecting portion 11*b*, from the upper side. Since the cover coupling portions 12*g* like this are provided, reinforcement in a case of insertion/removal of the receptacle connector (first electric connector) 10 and the plug connector (second electric connector) 20 is carried out.

The plate-shaped protruding pieces constituting the cover coupling portions 12*g* are formed so as to have the surfaces flat to the planar covers 12*f* and continued therefrom and are extending within the plate thickness of the planar cover 12*f*. In this manner, the cover coupling portions 12*g* provided at the planar covers 12*f* in this manner are disposed in the state in which they are within the range of the plate thickness of the planar covers 12*f* and do not bulge to the outer side of the planar covers 12*f*. Therefore, the height of the entire connector can be reduced.

Meanwhile, the plurality of cover coupling portions 12*g* provided at the planar cover 12*f* are disposed at constant intervals in the connector longitudinal direction as described above, and, in the region of the interval between the pair of cover coupling portions 12*g* and 12*g* which are adjacent to each other in the connector longitudinal direction, a planar test window 12*h* composed of the space which enables visual check of the board-connecting leg portions (contact connecting portions) 13*f* of the signal contact members 13 in the downward direction is formed.

More specifically, the cover coupling portions 12*g* provided in the above described electrically-conductive shells (shield wall portions) 12 are in a disposition relation in which the installation positions thereof in the connector longitudinal direction are shifted with respect to the board-connecting leg portions (contact connecting portions) 13*f* of the signal contact members 13, and there is a relation that the cover coupling portion 12*g* is disposed in the part between the board-connecting leg portions 13*f* and 13*f*, which are adjacent to each other in the connector longitudinal direction. In the part between the pair of cover coupling portions 12*g* and 12*g*, which are adjacent to each other in the connector longitudinal direction, a laterally-long spatial part formed by the cover coupling portions 12*g* and 12*g* and the inner edge portion of the planar cover 12*f* of the electrically-conductive shell 12 is formed, and the laterally-long spatial part is formed into the above described planar check window 12*h*.

The connector-longitudinal-direction length of the planar check window 12*h* according to the present embodiment is formed so as to correspond to the length in which the plurality (three) of board-connecting leg portions (contact connecting portions) 13*f* are juxtaposed. In a case in which an assembly operator carries out visual check toward the downward direction through the planar check window 12*h*, the end surfaces of the plurality (three) of board-connecting leg portions 13*f* are configured to be visually checked in the inner region of the planar check window 12*h*.

In this manner, in the present embodiment, through the lateral check windows 12*e* and the planar check windows 12*h* provided in the electrically-conductive shells 12, the connection state of the board-connecting leg portions (contact connecting portions) 13*f* with respect to the signal-transmitting electrically-conductive paths (signal pads) P1*a* of the first wiring board P1 and the assembly state of the connectors are configured to be checked by visual from the lateral side and the upper side.

[About Contact Pieces]

Furthermore, on the planar cover 12*f* of the above described electrically-conductive shell 12 and the part bent and extending downward from the planar cover 12*f* to the longitudinal lateral wall plate 12*a*, plate-spring-shaped contact pieces 12*i*, which elastically contact the mating counterpart, are integrally formed so as to be cut and raised therefrom. The plurality of contact pieces 12*i* are formed at constant intervals in the connector longitudinal direction, the root parts of the plate-spring-shaped members constituting the contact pieces 12*i* are provided in the planar cover 12*f* side, and the distal-end parts of the plate-spring-shaped members are formed so as to obliquely bulge toward the connector-width-direction outer side from the outer surface of the longitudinal lateral wall plate 12*a*.

There is a disposition relation that, when the plug connector (second electric connector) 20 is mated with the receptacle connector (first electric connector) 10 from the upper side, the distal-end parts of the above described contact pieces 12*i* elastically contact the electrically-conductive shells of the plug connector 20 (described later) from the inner side. This point will be described later in detail.

Note that each of the above described contact pieces 12*i* is disposed at the part between the pair of cover coupling portions 12*g* and 12*g*, which are adjacent to each other in the connector longitudinal direction. Since the contact pieces 12*i* are in the disposition relation in which the contact pieces 12*i* are positionally shifted in the connector longitudinal direction with respect to the cover coupling portions 12*g* in such a manner, the pressing force applied to the contact pieces 12*i* does not directly act on the cover coupling portions 12*g*, and, as a result, the strength of the cover coupling portions 12*g* is maintained.

[About Mating Guide]

On the other hand, the surface of the planar cover 12*f* provided at the longitudinal lateral wall plate 12*a* of the electrically-conductive shell (shield wall portion) 12 in the above described manner is formed into a sliding guide surface which allows mutual contact movement when both of the electric connectors 10 and 20 are to be mated with each other. Moreover, with respect to the surface of the planar cover 12*f* formed into the sliding guide surface like this, the top surfaces of the fixation latch pieces 12*c* and 12*c* continued to the upper edge part of the short-side lateral wall plate 12*b* of the electrically-conductive shell 12 are disposed so as to be approximately at the same height as the surface of the planar cover 12*f*, and the top surfaces of the fixation latch pieces 12*c* are also formed into sliding guide surfaces when both of the electric connectors 10 and 20 are to be mated with each other. In this manner, the fixation latch pieces 12*c* provided in the electrically-conductive shell 12 are provided with the configuration as the auxiliary cover with respect to the planar cover 12*f*, and the planar cover 12*f* and the auxiliary cover 12*c* constitute a sliding guide surface.

The surfaces of the later-described electrically-conductive shells 22 of the plug connector (second electric connector) 20 are configured to contact, from the upper side, and slide on the planar covers 12*f* and the auxiliary covers (fixation latch pieces) 12*c* constituting the sliding guide surface like this, and guiding to a mating position determined in advance is carried out. This point will be also described later in detail.

[About Electrically-Conductive Shells of Plug Connector]

On the other hand, the electrically-conductive shells 22 provided as the shield wall portions in the plug connector (second electric connector) 20 side are also formed by a frame-shaped structure divided into two bodies and are attached to the insulating housing 21 in a state in which they are disposed to be opposed so as to face each other. More specifically, each of the pair of electrically-conductive shells (shield wall portions) 22 and 22 is formed by a bent member of thin-plate-shaped metal forming approximately a U-shape in a planar view, and the longitudinal lateral wall plate 22*a* constituting the long-side part of the planarly approximately U-shape of each of the electrically-conductive shells 22 is disposed so as to extend along the connector longitudinal direction.

Meanwhile, at connector-longitudinal-direction both-end parts of the above described longitudinal lateral wall plate 22*a*, fixation latch pieces 22*b* and 22*b*, which are bent at approximately right angle toward the electrically-conductive shell 22 of the other side disposed to be opposed thereto, are integrally continued therefrom. The fixation latch pieces 22*b* and 22*b* of each of the electrically-conductive shells 22 are extending in the connector width direction and are buried in the base end portions 21*a* and 21*a*, which constitute the connector-longitudinal-direction edge parts of the insulating housing 21, by insert molding, thereby causing the entire electrically-conductive shell 22 to be in a state fixed to the insulating housing 21.

Herein, engagement holes 22*f* for carrying out positioning with respect to the insulating housing 21 and enhancing fixation latch force are formed to penetrate through the fixation latch pieces 22*b* of each of the above described electrically-conductive shells 22, and latch protrusions 21*e* provided on the base end portions 21*a* of the insulating housing 21 are molded so as to be in a state in which they penetrate through the engagement holes 22*f* of the electrically-conductive shells 22 when the insert molding as described above is carried out.

The longitudinal lateral wall plates 22*a* and 22*a* constituting the above described pair of electrically-conductive shells (shield wall portions) 22 and 22 are disposed to be opposed to each other approximately in parallel, and the fixation latch pieces 22*b* and 22*b* constituting the short-side lateral wall plates are disposed to face each other in the connector width direction, thereby constituting the frame structure which forms an approximately rectangular shape as an overall shape in a planar view.

In this manner, in the plug connector (second electric connector) 20 side, the frame structure in which the pair of electrically-conductive shells (shield wall portions) 22 and 22 forming an approximately U-shape in a plane are disposed to be opposed to each other is formed. On the other hand, in the above described receptacle connector (first electric connector) 10 side, the frame structure in which the pair of electrically-conductive shells (shield wall portions) 12 and 12 forming an approximately L-shape in a plane are disposed to each other is formed. Therefore, in a state in which both of the electric connectors 10 and 20 are mated with each other, the gaps generated by disposing the electrically-conductive shells 12 and 12 of the receptacle connector 10 side to be opposed to each other are covered by the electrically-conductive shells 22 of the plug connector 20 side from the outer side, and the gaps generated by disposing the electrically-conductive shells 22 and 22 of the plug connector 20 side to be opposed to each other are covered by the electrically-conductive shells 12 of the receptacle connector 10 side from the inner side. As a result, a state in which the entire periphery of the electric connector device is completely covered by the shield wall portions is obtained so that an extremely good shield function is obtained.

On the other hand, a plurality of ground connecting portions 22*c*, which are composed of plate-shaped protruding pieces projecting to the lower side toward the surface of the second wiring board P2, are formed on the lower edge portions of the longitudinal lateral wall plates 22*a* and the fixation latch pieces (short-side lateral wall plates) 22*b* of the electrically-conductive shells (shield wall portions) 22. The plate-shaped protruding piece constituting each of the ground connecting portions 22*c* is formed so as to have the surface flat to the longitudinal lateral wall plate 22*a* or the fixation latch piece (short-side lateral wall plate) 22*b* and continued, and the plate-shaped protruding piece is extending within the plate thickness of the longitudinal lateral wall plate 22*a* or the fixation latch piece (short-side lateral wall plate) 22*b*.

In the plug connector (second electric connector) 20 according to the present embodiment like this, the fixation latch pieces (short-side lateral wall plates) 22*b* provided at both-end parts of the longitudinal lateral wall plates 22*a* of the electrically-conductive shells (shield wall portions) 22 are subjected to insert molding so as to be buried in the base end portions 21*a* of the insulating housing 11. Therefore, the electrically-conductive shells 22 disposed in the state in which the electrically-conductive shells 22 are housed within the range of the total length of the insulating housing 21 do not bulge to the outer side of the insulating housing 21 so that the entire connector is downsized in the connector longitudinal direction. In addition, in the present embodiment, the ground connecting portions (plate-shaped protruding pieces) 22*c* of the electrically-conductive shells (shield wall portions) 22 are disposed in the state in which they are within the range of the plate thickness of the electrically-conductive shells 22. Therefore, the ground connecting portions 22*c* do not bulge to the outer side of the electrically-conductive shells so that the entire connector is further downsized also in the connector width direction.

Note that the lower end portions of the above described ground connecting portions 22*c* are electrically connected when they are solder-joined with ground electrically-conductive paths (ground pads) P2*c* provided on the surface of the second wiring board P2, and the solder-joining of the ground connecting portions 22*c* in this case is collectively carried out with respect to all of the ground connecting portions 22*c* by using a solder material having a long shape.

Since the electrically-conductive shells (shield wall portions) 22 composed of the frame structure having the planarly approximately rectangular shape like this is formed so as to surround the entire outer periphery of the insulating housing 21, electromagnetic shielding with respect to the signal contact members 23 attached to the insulating housing 21 is carried out.

Particularly, the longitudinal lateral wall plate 22*a* of the electrically-conductive shell (shield wall portion) 22 is in a disposition relation in which the longitudinal lateral wall plate 22*a* stand on the surface of the second wiring board P2 at a position that has a predetermined interval in the connector width direction from the board-connecting leg portions (contact connecting portions) 23*c* of the above described signal contact members 23. More specifically, since the longitudinal lateral wall plate 22*a* of the electrically-conductive shell 22 is opposed to the outer end surfaces of the board-connecting leg portions 23*c* of the signal contact members 23 and is extending in the connector longitudinal direction (multipolar-shape arrangement direction), the electromagnetic shielding with respect to the entire signal contact members 23 including the board-connecting leg portions 23*c* is configured to be carried out well in a state in which impedance matching is appropriately carried out via the spatial part between the above described board-connecting leg portions 23*c* and the longitudinal lateral wall plate 22*a* of the electrically-conductive shell 22.

As described above, in the present embodiment, in each of the receptacle connector (first electric connector) 10 and the plug connector (second electric connector) 20, the electromagnetic shielding function with respect to the board-connecting leg portions (contact connecting portions) 13*f* or 23*c* is configured to be obtained by the electrically-conductive shells 12 or 22 provided as the shield wall portions thereof. When both of the electric connectors 10 and 20 are mated with each other, the electrically-conductive shells 12 and 22 are doubly disposed inside/outside, and the gap formed between the shield wall portion formed by one of the electrically-conductive shells 12 and 22 and one of the wiring boards P1 and P2 is partially covered by the shield wall portion formed by the other one of the electrically-conductive shells 12 and 22. Therefore, an extremely good shielding function is obtained as the electric connector device. Particularly, since the gaps between the electrically-conductive shells 12 and 22 and the first and second wiring boards P1 and P2 can be efficiently blocked, sufficient EMI measured can be expected.

[About Lateral Check Windows]

Meanwhile, the plurality of ground connecting portions (plate-shaped protruding pieces) 22*c* provided on the longitudinal lateral wall plate 22*a* of the above described electrically-conductive shell (shield wall portion) 22 are disposed at the constant intervals in the connector longitudinal direction (multipolar-shape arrangement direction), and, in the region of the interval between the pair of ground connecting portions 22*c* and 22*c* adjacent to each other in the connector longitudinal direction, a lateral check window 22*d* composed of the space that enables visual check of the board-connecting leg portions (contact connecting portions) 23*c* of the signal contact members 23 toward the connector width direction is formed.

More specifically, each of the ground connecting portions 22*c* provided in the above described electrically-conductive shell (shield wall portion) 22 is in a disposition relation in which the installation position thereof in the connector longitudinal direction is shifted with respect to the board-connecting leg portions (contact connecting portions) 23*c* of the signal contact members 23, and there is a relation that the ground connecting portion 22*c* is disposed in the part between the board-connecting leg portions 23*c* and 23*c*, which are adjacent to each other in the connector longitudinal direction. In the part between the pair of ground connecting portions 22*c* and 22*c* adjacent to each other in the connector longitudinal direction, a laterally-long spatial part formed by the ground connecting portions 22*c* and 22*c* and the lower edge portion of the longitudinal lateral wall plate 22*a* of the electrically-conductive shell 22 is formed, and the laterally-long spatial part is formed into the above described lateral check window 22*d*.

The length of the lateral check window 22*d* according to the present embodiment in the connector longitudinal direction is formed so as to correspond to the length in which the plurality (three) of board-connecting leg portions (contact connecting portions) 23*c* are juxtaposed so that, when the assembly operator carries out visual check toward the connector width direction through the lateral check window 22*d*, the end surfaces of the plurality (three) of board-connecting leg portions 23*c* can be visually checked in the inner region of the lateral check window 22*d*.

In this manner, also in the plug connector (second electric connector) 20 according to the present embodiment, the connection state of the board-connecting leg portions (contact connecting portions) 23*c* with respect to the signal-transmitting electrically-conductive paths (signal pads) P2*a* of the second wiring board P2 and the assembly state of the connectors can be visually checked from the lateral side through the lateral check windows 22*d* provided in the electrically-conductive shells 22.

Meanwhile, when both of the electric connectors 10 and 20 are mated with each other, the electrically-conductive shells (shield wall portions) 22 provided in the plug connector (second electric connector) 20 like this are disposed so as to cover the entire outer periphery of the receptacle connector (first electric connector) 10 from the outer side. In that process, there is a disposition relation that the inner wall surfaces of the electrically-conductive shells 22 of the plug connector 20 elastically contact the distal-end parts of the contact pieces 12*i*, which are provided in the electrically-conductive shells 12 of the above described receptacle connector 10, from the outer side. As a result, both of the electrically-conductive shells 12 and 22 are caused to be in an electrically ground connection state.

More specifically, in the present embodiment, when both of the electric connectors 10 and 20 are mated with each other, an electrically ground connection is established through the contact pieces 12*i* provided in the electrically-conductive shells (shield wall portions) 12 of the receptacle connector (first electric connector) 10. Therefore, ground resistance is reduced, and, corresponding to that, shield characteristics are improved.

[About Mating Guide]

On the other hand, the upper edge parts of the longitudinal lateral wall plates 22*a* of the above described electrically-conductive shells (shield wall portions) 22 are formed into sliding guide surfaces which allow mutual contact movement when both of the electric connectors 10 and 20 are mated with each other. The longitudinal lateral wall plates 22*a* serving as the sliding guide surfaces are in a disposition relation in which they can contact, from the upper side, the planar covers 12*f*, which are provided so as to similarly form the sliding guide surfaces on the electrically-conductive shells 12 of the above described receptacle connector (first electric connector) 10. As shown in FIG. 27 to FIG. 29, positioning with respect to the mating positions determined in advance is configured to be carried out by causing the longitudinal lateral wall plates 22*a* of the electrically-conductive shells 22 of the up/down-inverted plug connector (second electric connector) 20 to be in a state in which they are disposed to contact, from the upper side, the planar covers 12*f* of the electrically-conductive shells 12 of the receptacle connector (first electric connector) 10 disposed in the lower side and carrying out relative sliding in the state in which the contact disposition is maintained.

Herein, in the corner regions at the four corners of the electrically-conductive shells (shield wall portions) 22 provided in the plug connector (second electric connector) 20, in other words, at the parts at which the longitudinal lateral wall plates 22*a* and the fixation latch pieces 22*b* constituting the short-side lateral wall plates are coupled, in total, four positioning portions 22*e* which regulate both of the electric connectors 10 and 20 to the mating positions are provided. Each of the positioning portions 22*e* is formed by a mount-shaped projection-shaped part projecting from the upper edges of the longitudinal lateral wall plate 22*a* and the fixation latch piece (short-side lateral wall plate) 22*b* to form a step, and the positioning portion is formed so as to extend in the connector longitudinal direction and the connector width direction along the coupling shape of the longitudinal lateral wall plate 22*a* and the fixation latch piece (short-side lateral wall plate) 22*b* and form an approximately L-shape in a plane.

When relative sliding is carried out in the state in which the longitudinal lateral wall plates 22*a* of the electrically-conductive shells 22 of the plug connector (second electric connector) 20 are disposed to contact, from the upper side, the planar covers 12*f* of the electrically-conductive shells 12 of the receptacle connector (first electric connector) 10 disposed in the lower side in the above described manner to reach the mating positions determined in advance, the positioning portions 22*e* provided on the electrically-conductive shells 22 in the plug connector 20 side fit in the four corner portions of the electrically-conductive shells 12 of the receptacle connector 10 side from the outer side, and positioning of the mating positions is configured to be carried out as a result.

Note that, in the state in which both of the electric connectors 10 and 20 are mated with each other, the positioning portions 22*e* provided on the electrically-conductive shells 22 of the plug connector (second electric connector) 20 are disposed to be opposed to the surface of the first wiring board P1 on which the receptacle connector (first electric connector) 10 is mounted, wherein no electrically-conductive path, etc. are formed on the surface of the first wiring board P1 on which the positioning portions 22*e* are disposed to be opposed thereto. Therefore, even when the heights of both of the electric connectors 10 and 20 are reduced, a situation in which the positioning portions 22*e* contacts the surface of the first wiring board P1 upon mating is configured to be avoided.

In this manner, in the present embodiment, when both of the electric connectors 10 and 20 are to be mated with each other, they are relatively moved while the sliding surfaces 12*f* and 22*a* of the electrically-conductive shells 12 and 22 of both of the electric connectors 10 and 20 are in contact with each other. Therefore, the relative movement of the electric connectors 10 and 20 is carried out well in a low friction state.

When the relative movement between the electric connectors 10 and 20 as described above is carried out, the sliding guide surfaces 12*f* and 22*a* composed of electrically-conductive members such as metal are brought into a mutually contacted state. Therefore, compared with the contact state of other materials such as resin, problems in terms of usage durability such as scraping and breakage do not easily occur.

Furthermore, when movement to the final mating positions is carried out, the positions are regulated by the positioning portions 22*e* provided on the electrically-conductive shells (shield wall portions) 22. Therefore, the mating operation is smoothly carried out.

Hereinabove, the invention accomplished by the present inventor has been described in detail based on the embodiment. However, the present invention is not limited to the above described embodiment, and it goes without saying that various modifications can be made within a range not departing from the gist thereof.

For example, the plate-spring-shaped members constituting the contact pieces 12*i* in the above described embodiment can be configured to provide the base-end parts of the root side on the longitudinal lateral wall plates 12*a* and to provide the distal-end parts of the contact pieces 12*i* in the planar cover 12*f* side. Furthermore, the connection counterparts of the contact pieces 12*i* are not limited to the counterpart connector, and, for example, a configuration in which they are connected with an electrically-conductive chassis of a device can be also employed.

Moreover, the power-source contact members 14 and 24 in the above described embodiment can serve as ground contact members for grounding.

Furthermore, the recess/projection mating relations between the contact members 12 and 22 in the above described embodiment can be disposed in reversed relations between the receptacle connector 10 and the plug connector 20.

As described above, the present invention can be widely applied to various board-connecting electric connector devices used in various electronic/electric devices.

What is claimed is:

1. A board-connecting electric connector comprising:

a plurality of contact members attached to an insulating housing, the contact members being arranged so as to form a multipolar shape in a connector longitudinal direction;

a contact connecting portion provided in each of the contact members so as to extend in a connector width direction and electrically connected to a wiring board side;

a shield wall portion composed of an electrically-conductive member opposed to the contact connecting portion via a spatial part in the connector width direction, the shield wall portion being provided so as to extend along the connector longitudinal direction;

a plurality of ground connecting portions electrically connected to the wiring board and formed in the shield wall portion along the connector longitudinal direction, each of the ground connecting portions disposed in a part between the contact connecting portions adjacent to each other in the connector longitudinal direction; and a lateral check window composed of space enabling visual check of the contact connecting portion in the connector width direction, the lateral check window being formed in an interval region in which the ground connecting portions are adjacent to each other in the connector longitudinal direction, wherein the shield wall portion is provided with a planar cover partially covering, approximately in parallel with the wiring board, a surface of the insulating housing, a plurality of cover coupling portions coupled to the insulating housing are provided in the planar cover along the connector longitudinal direction, the cover coupling portion is disposed in a part between the contact connecting portions adjacent to each other in the connector longitudinal direction, and a planar check window composed of a space enabling visual check of the contact connecting portion in a direction orthogonal to the wiring board is formed in an interval region in which the cover coupling portions are adjacent to each other the connector longitudinal direction.

2. The board-connecting electric connector according to claim 1, wherein the shield wall portion is formed by a plate-shaped member extending along the connector longitudinal direction;

the ground connecting portion is formed by a plate-shaped protruding piece projecting from an edge portion of the shield wall portion toward the wiring board side; and the plate-shaped protruding piece constituting the ground connecting portion is extending within a plate thickness of the plate-shaped member constituting the shield wall portion.

3. The board-connecting electric connector according to claim 2, wherein the plate-shaped protruding piece has a surface flat to the shield wall portion.

4. The board-connecting electric connector according to claim 1, wherein the shield wall portion is provided with a fixation latch piece extending so as to be bent from a connector-longitudinal-direction end portion of the shield wall portion toward the connector width direction; and the fixation latch piece is buried in a connector-longitudinal-direction edge part of the insulating housing.

5. The board-connecting electric connector according to claim 1, wherein the shield wall portion or the planar cover is integrally formed with a contact piece having a plate-spring shape elastically contacting a mating counterpart.

6. The board-connecting electric connector according to claim 1, wherein the planar cover is formed by a plate-shaped member extending along the connector longitudinal direction;

the cover coupling portion is formed so as to project from an edge portion of the planar cover toward a connector central side; and the cover coupling portion is extending within a plate thickness of the planar cover so as to have a surface flat to the planar cover and continued therefrom.

* * * * *